(12) United States Patent
Yoshida et al.

(10) Patent No.: US 6,925,102 B2
(45) Date of Patent: Aug. 2, 2005

(54) SEMICONDUCTOR LASER DEVICE, SEMICONDUCTOR LASER MODULE, AND RAMAN AMPLIFIER USING THE DEVICE OR MODULE

(75) Inventors: Junji Yoshida, Tokyo (JP); Naoki Tsukiji, Tokyo (JP); Satoshi Irino, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 464 days.

(21) Appl. No.: 10/259,319

(22) Filed: Sep. 30, 2002

(65) Prior Publication Data

US 2005/0018727 A1 Jan. 27, 2005

(30) Foreign Application Priority Data

Sep. 28, 2001 (JP) ........................................ 2001-300567

(51) Int. Cl.⁷ ................................................. H01S 3/08
(52) U.S. Cl. ............................. 372/96; 372/43; 372/45; 372/46; 372/102; 372/103
(58) Field of Search ................................ 372/45, 46, 96, 372/102, 103

(56) References Cited

U.S. PATENT DOCUMENTS

| | | | | |
|---|---|---|---|---|
| 5,077,752 A | * | 12/1991 | Tada et al. | .................... 372/96 |
| 6,198,863 B1 | * | 3/2001 | Lealman et al. | ............... 385/37 |
| 6,384,963 B2 | | 5/2002 | Ackerman et al. | |

* cited by examiner

Primary Examiner—Minsun Oh Harvey
Assistant Examiner—Dung Nguyen
(74) Attorney, Agent, or Firm—Oblon, Spivak, McClelland, Maier & Neustadt, P.C.

(57) ABSTRACT

A semiconductor laser device which has a diffraction grating partially provided in the vicinity of an active layer formed between a radiation-side reflection film provided on a radiation-side end surface of a laser beam and a reflection film provided on a reflection-side end surface of the laser beam, and which outputs a laser beam having a desired oscillation longitudinal mode based on a wavelength selection characteristic of at least the diffraction grating. The diffraction grating is formed in isolation with an isolation distance of $Ls=15\ \mu m$ from the radiation-side reflection film.

16 Claims, 17 Drawing Sheets

SEMICONDUCTOR LASER DEVICE 20
- 10 p-SIDE ELECTRODE
- 7 p-InGaAsP CONTACT LAYER
- 6 p-InP CLADDING LAYER
- 9 n-InP BLOCKING LAYER
- 8 p-InP BLOCKING LAYER
- 2 n-InP BUFFER LAYER
- 1 n-InP SUBSTRATE
- 11 n-side ELECTRODE
- 3 GRIN-SCH-MQW ACTIVE LAYER
- 2 n-InP BUFFER LAYER
- 13 DIFFRACTION GRATING
- 4 p-InP SPACER LAYER

REFLECTION FILM 14
RADIATION-SIDE REFLECTION FILM 15

$3200\,\mu m \geq L \geq 800\,\mu m$

FIG.10
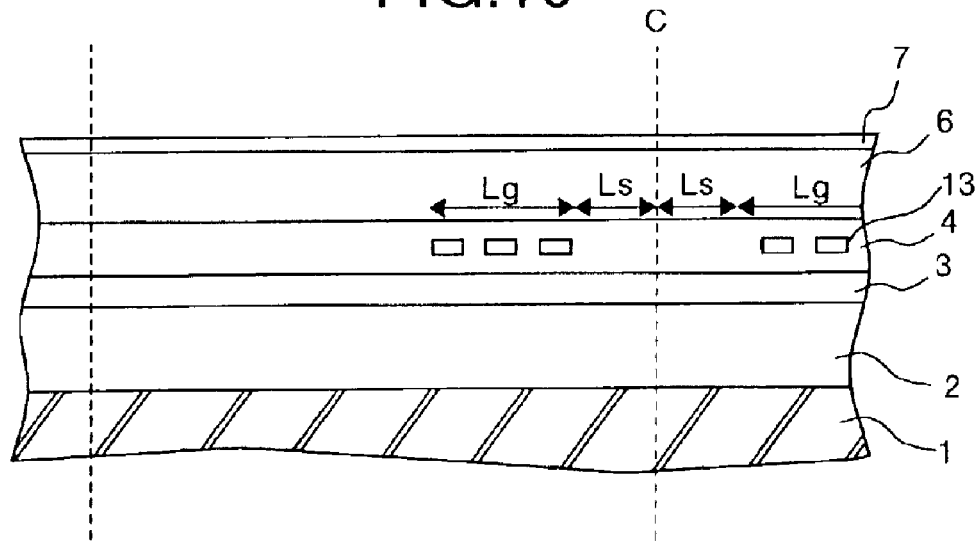
FIG.11
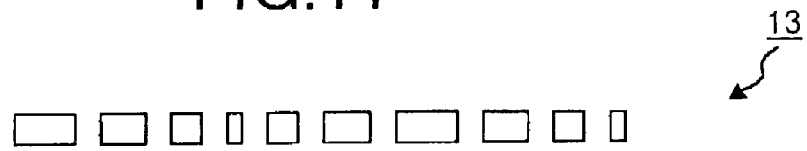
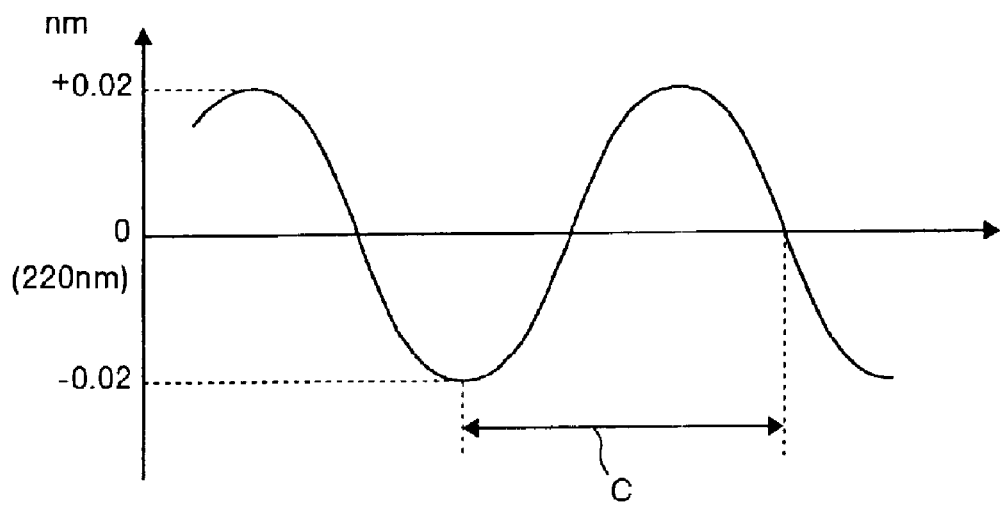

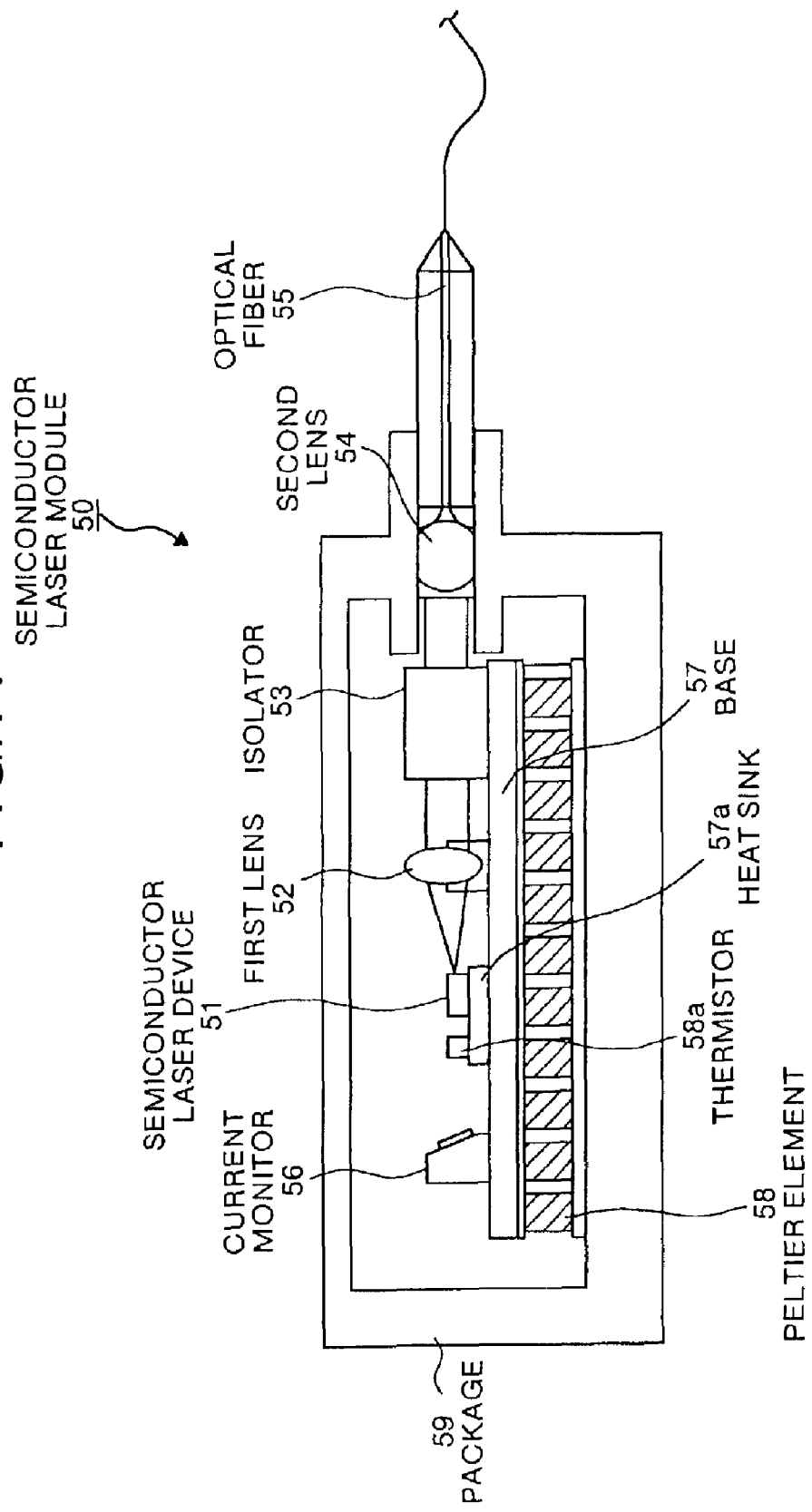

SEMICONDUCTOR LASER DEVICE, SEMICONDUCTOR LASER MODULE, AND RAMAN AMPLIFIER USING THE DEVICE OR MODULE

FIELD OF THE INVENTION

The present invention relates to a semiconductor laser device suitable for application to an excitation light source such as a Raman amplifier, a semiconductor laser module and a Raman amplifier using the device or the module.

BACKGROUND OF THE INVENTION

In recent years, along the distribution of various multimedia such as Internet, there has been an increasing demand for the increase in the capacity of optical communications. Conventionally, in the optical communications, it has been general to transmit information using a single wavelength in a band of 1310 nm or 1550 nm as a wavelength that has small light absorption by an optical fiber. In this method, it is necessary to increase the number of cores of optical fibers that are laid in a transmission path in order to transmit a large quantity of information. Therefore, there has been a problem of increase in cost along the increase in the transmission capacity.

Therefore, a DWDM (Dense-Wavelength Division Multiplexing) communication method has come to be used. In this DWDM communication method, an EDFA (Erbium Doped Fiber Amplifier) is mainly used, to transmit information using a plurality of wavelengths in the 1550 nm band as the operation band thereof. In the DWDM communication method or the WDM communication method, optical signals of a plurality of different wavelengths are simultaneously transmitted using one optical fiber. Therefore, it is unnecessary to newly add a line, and thus, it is possible to remarkably increase the transmission capacity of the network.

A general WDM communication method that uses the EDFA has been put into practical use from 1550 nm which is easy for flatting the gain, and recently, the band has been expanded to 1580 nm which has not been utilized due to a small gain coefficient. However, as a low-loss band of the optical fiber is wider than a band capable of being amplified by the EDFA, there has been high interest in an optical amplifier operated in the band outside the EDFA band, i.e., the Raman amplifier.

A gain wavelength range of an optical amplifier using a rare earth ion such as erbium as a medium is determined by an energy level of ion. On the other hand, the Raman amplifier has a characteristic that the gain wavelength range is determined by a wavelength of an exciting light. Therefore, it is possible to amplify any optional wavelength range by selecting the exciting light wavelength.

In the Raman amplification, when a strong exciting light is incident to the optical fiber, a gain appears on the long wavelength side by about 100 nm from the exciting light wavelength by a stimulated Raman scattering. When a signal light in the wavelength range having this gain is incident to the optical fiber in this excited state, this signal light is amplified. Therefore, in the WDM communication method using the Raman amplifier, it is possible to further increase the number of channels of the signal light as compared with a communication method using the EDFA.

FIG. 22 is a block diagram that shows a structure of a conventional Raman amplifier that is used for the WDM communication system. In FIG. 22, semiconductor laser modules 182a to 182d which include Fabry-Perot type semiconductor light emission elements 180a to 180d and fiber gratings 181a to 181d in pairs respectively, output laser beams which are the excitation light source to polarization beam combiners 61a and 61b. The wavelengths of laser beams output from the respective semiconductor laser modules 182a and 182b are the same, but the light having a different planes of polarization is multiplexed by the polarization beam combiner 61a. Similarly, the wavelengths of laser beams output from the respective semiconductor laser modules 182c and 182d are the same, but light having different planes of polarization is multiplexed by the polarization beam combiner 61b. The polarization beam combiners 61a and 61b output the polarization-multiplexed laser beams respectively to the WDM coupler 62. The wavelengths of laser beams output from the polarization beam combiners 61a and 61b are different from each other.

The WDM coupler 62 couples the laser beams output from the polarization beam combiners 61a and 61b through an isolator 60, and outputs it to an amplification fiber 64 as the exciting light through a WDM coupler 65. The signal light to be amplified is input from a signal light input fiber 69 through an isolator 63 to the amplification fiber 64 to which the exciting light has been input, and it is coupled with the exciting light and is Raman-amplified.

The signal light (amplified signal light) Raman-amplified in the amplification fiber 64 is input to a monitor light distribution coupler 67 through a WDM coupler 65 and an isolator 66. The monitor light distribution coupler 67 outputs a part of the amplified signal light to a control circuit 68, and outputs the remaining amplified signal light to a signal optical output fiber 70 as an output laser beam.

The control circuit 68 controls the light emitting state, e.g., the optical intensity, of the respective semiconductor light emission elements 180a to 180d based on a part of the input amplified signal light, and performs feedback control to obtain a flat characteristic in the gain band of the Raman amplification.

FIG. 23 is a diagram that shows a schematic structure of the semiconductor laser module that uses the fiber grating. In FIG. 23, a semiconductor laser module 201 has a semiconductor light emission element 202 and an optical fiber 203. The semiconductor light emission element 202 has an active layer 221. The active layer 221 is provided with a light reflection surface 222 at one end, and is provided with a light radiation surface 223 at the other end. Light generated in the active layer 221 is reflected by the light reflection surface 222, and is output from the light radiation surface 223.

The optical fiber 203 is disposed on the light radiation surface 223 of the semiconductor light emission element 202, and is optically coupled to the light radiation surface 223. In a core 232 in the optical fiber 203, a fiber grating 233 is formed at a predetermined position from the light radiation surface 223, and the fiber grating 233 selectively reflects light of the specific wavelength. That is, the fiber grating 233 functions as an external resonator, and forms a resonator between the fiber grating 233 and the light reflection surface 222. A laser beam of a specific wavelength selected by the fiber grating 233 is output as an output laser beam 241.

However, in the above-described semiconductor laser module 201 (182a to 182d), a distance between the fiber grating 233 and the semiconductor light emission element 202 is long. Therefore, RIN (Relative Intensity Noise) becomes large due to resonance between the fiber grating 233 and the light reflection surface 222. In the Raman amplification, the process in which the amplification occurs comes early. Therefore, when the exciting light intensity is fluctuated, the Raman gain also fluctuates. The fluctuation of the Raman gain is directly output as the fluctuation of the amplified signal intensity, which causes a problem in that stable Raman amplification cannot be carried out.

For the Raman amplifier, there are also a front-side excitation method which excites a signal light from the front-side, and a bi-directional excitation method which bi-directionally excites a signal light, in addition to a rear-side excitation method which excites a signal light from the rear side, like the Raman amplifier shown in FIG. 32. At present, the rear-side excitation method is mainly used as the Raman amplifier. The reason is that the front-side excitation method in which the weak signal light proceeds in the same direction together with the strong exciting light has a problem in that the exciting light intensity fluctuates in the semiconductor laser module using the fiber grating. Therefore, a stable excitation light source that can be applied to the front-side excitation method has been required. That is, there has been a problem that the applicable excitation method is limited, when a semiconductor laser module using the conventional fiber grating is used.

Further, the semiconductor laser module 201 needs to optically couple the optical fiber 203 having the fiber grating 233 with the semiconductor light emission element 202. As the optical coupling is carried out mechanically in the resonator, there is a risk that the oscillation characteristic of the laser may vary due to mechanical vibrations. As a result, there has been a problem that it is not possible to provide stable exciting light.

Further, the Raman amplification in the Raman amplifier is based on a condition that a polarization direction of the signal light and a polarization direction of the exciting light coincide with each other. That is, the Raman amplification has a polarization dependency of the amplified gain, and it is necessary to reduce an influence caused by a deviation between the polarization direction of the signal light and the polarization direction of the exciting light. According to the rear-side excitation method, the signal light has no problem as the polarization becomes random during propagation. However, according to the front-side excitation method, the polarization dependency is strong, and it is necessary to reduce the polarization dependency by cross polarization synthesis, or depolarization or the like of the exciting light. That is, it is necessary to reduce the degree of polarization (DOP).

SUMMARY OF THE INVENTION

It is an object of the present invention to provide a semiconductor laser device that is suitable for excitation light source for a Raman amplifier or the like, and that can stably output a laser beam of a desired oscillation wavelength in high efficiency, a semiconductor laser module and a Raman amplifier using the device or the module.

According to one aspect of the present invention, there is provided a semiconductor laser device which comprises a diffraction grating partially provided in the vicinity of an active layer formed between a first reflection film provided on a radiation-side end surface of a laser beam and a second reflection film provided on a reflection-side end surface of the laser beam. The semiconductor laser device outputs a laser beam having a desired longitudinal oscillation mode based on a wavelength selection characteristic according to at least the diffraction grating. The diffraction grating is provided in the vicinity of the first reflection film, and is formed with a distance of not larger than 50 μm from the first reflection film.

According to the above aspect, the diffraction grating is provided in the vicinity of the first reflection film, and is formed with a distance of not larger than 50 μm from the first reflection film. Based on this isolation, the unstability in the wavelength generated along a variation in a refractive index of the diffraction grating due to a rise in the temperature of the end surface of the first reflection film, is removed. Further, by keeping the distance of isolation not to exceed 50 μm, a kink attributable to an oscillation longitudinal mode hopping is avoided, thereby to realize a stable longitudinal multi-mode oscillation.

According another aspect of the present invention, there is provide a semiconductor laser module comprising the above-described semiconductor laser device, an optical fiber which guides a laser beam emitted from the semiconductor laser device to the outside, and an optical coupling lens system which optically couples the semiconductor laser device with the optical fiber.

According to the above aspect, as the resonator of the semiconductor laser device is not physically separated by using the semiconductor laser device which does not use a fiber grating, it is not necessary to align the optical axis. Hence, the assembly of the semiconductor laser module is facilitated and the oscillation characteristic of the laser is less prone to be changed by mechanical vibrations or the like. As a result, it is possible to output a stable laser beam reliably and stably, and to reduce the costs.

According to still another aspect of the present invention, the Raman amplifier uses the above-described semiconductor laser device or the above-described semiconductor laser module as an excitation light source for a broadband Raman amplification.

According to the above aspect, the Raman amplifier uses the above-described semiconductor laser device or the above-described semiconductor laser module as an excitation light source for broadband Raman amplification, to thereby exhibit the working effect of the semiconductor laser device or the semiconductor laser module.

According to still another aspect of the present invention, the Raman amplifier uses the above-described semiconductor laser device or the above-described semiconductor laser module as an excitation light source for broadband Raman amplification, and as a front-side excitation light source or a front-side excitation light source in a bi-directional excitation method.

According to the above aspect, the above-described semiconductor laser device or the above-described semiconductor laser module is used as an excitation light source for the broadband Raman amplification, and is used as a front-side excitation light source or a front-side excitation light source in a bi-directional excitation method to exhibit the working effect of the semiconductor laser device or the semiconductor laser module.

Other objects and features of this invention will become understood from the following description with reference to the accompanying drawings.

DESCRIPTION OF THE DRAWINGS

FIG. 10 is a cross-sectional view of the semiconductor wafer shown in FIG. 9.

FIG. 11 is a diagram that shows a structure of a chirped grating applied to the diffraction grating.

FIG. 14 is a longitudinal sectional view which shows a structure of a semiconductor laser module of a second embodiment of the invention.

DETAILED DESCRIPTION

Preferred embodiments of a semiconductor laser device, a semiconductor laser module and a Raman amplifier according to the invention will be explained below with reference to the accompanying drawings.

(First Embodiment)

Figure 1:
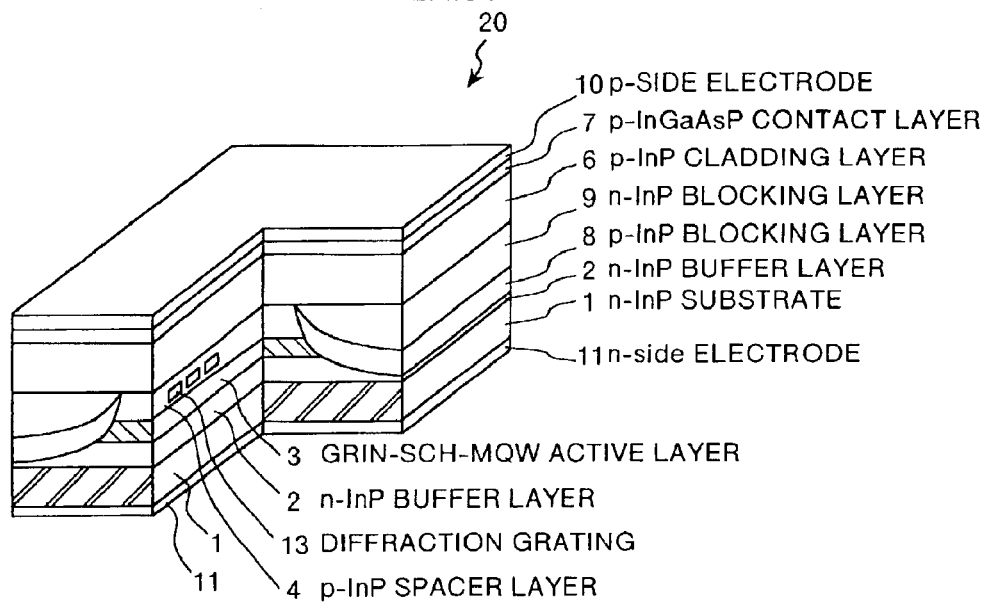
FIG. 1 is a cutaway view of a semiconductor laser device according to a first embodiment of the invention as viewed from a slanting direction.
Figure 2:
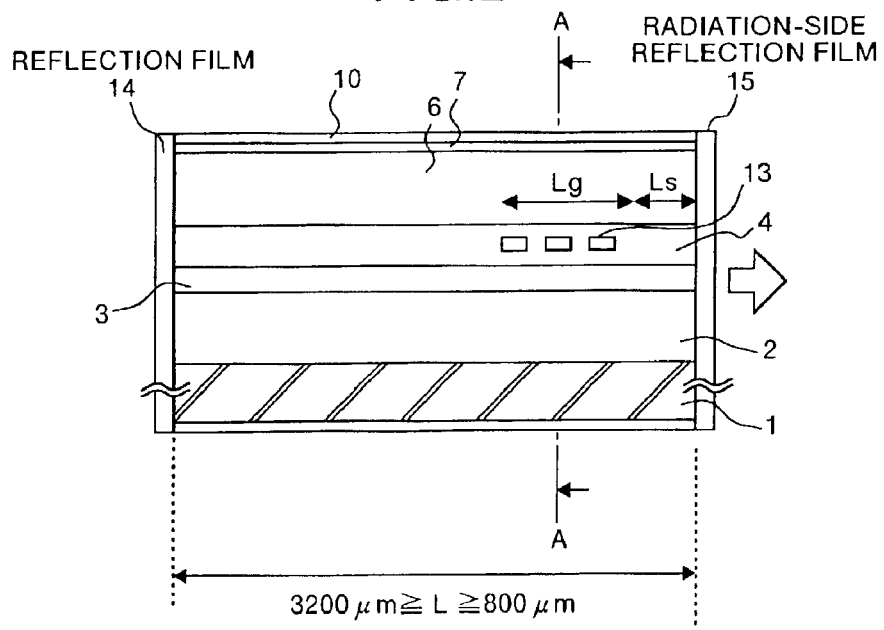
FIG. 2 is a longitudinal sectional view in a longitudinal direction that shows a structure of the semiconductor laser device of the first embodiment of the invention.
Figure 3:
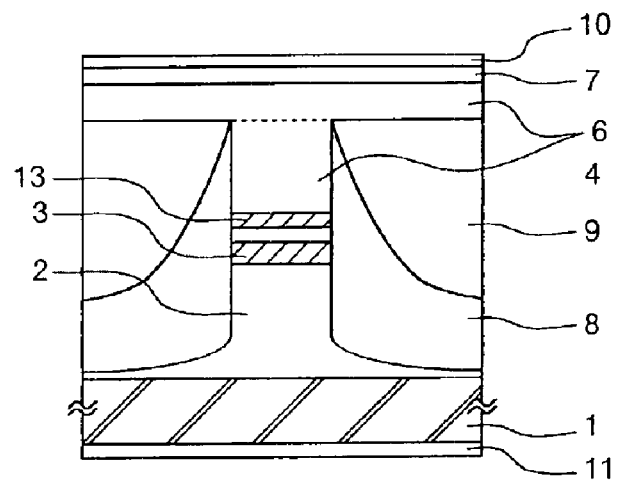
FIG. 3 is a cross-sectional view of the semiconductor laser device shown in FIG. 2 taken along the line A—A.

First, a first embodiment of the present invention will be explained. FIG. 1 is a cutaway view of a semiconductor laser device according to a first embodiment of the present invention as viewed from a slanting direction. FIG. 2 is a longitudinal sectional view in a longitudinal direction of the semiconductor laser device shown in FIG. 1. FIG. 3 is a cross-sectional view of the semiconductor laser device shown in FIG. 2 taken along the line A—A. In FIGS. 1 to 3, a semiconductor laser device 20 has a structure in which on a plane (100) of an n-InP substrate 1, the following elements are sequentially laminated; an n-InP cladding layer 2 serving as a buffer layer and a lower cladding layer by an n-InP, a GRIN-SCH-MQW (Graded Index-Separate Confinement Heterostructure Multi Quantum Well) active layer 3 having compressive strain, a P-InP spacer layer 4, a p-InP cladding layer 6 and an InGaAsP contact layer 7.

The P-InP spacer layer 4 is provided therein with a diffraction grating 13 having a film thickness of 20 nm. With a length Lg=50 $\mu$m isolated from a reflection side an end surface by Ls=15 $\mu$m toward the reflection film 14 side. The diffraction grating 13 is formed periodically at a pitch of about 220 nm, and selects a wavelength of a laser beam having a center wavelength of 1.48 $\mu$m. The P-InP spacer layer 4 including the diffraction grating 13, the GRIN-SCH-MQW active layer 3 and the upper portion of the n-InP buffer layer 2 are worked into a mesa stripe shape. Opposite sides of the mesa stripe in the longitudinal direction are embedded with a p-InP blocking layer 8 and a n-InP blocking layer 9 formed as current blocking layers. A p-side electrode 10 is formed on the upper surface of the p-InGaAsP contact layer 7.

A light reflection-side end surface which is one end surface of the semiconductor laser device 20 in the longitudinal direction is formed with the reflection film 14 having a high light reflection coefficient of 80% or higher, more preferably 98% or higher. A light radiation-side end surface which is the other end surface is formed with a radiation-side reflection film 15 having a low light reflection coefficient of 2%, 1%, 0.5% or lower, preferably 0.1% or lower. Light generated in the GRIN-SCH-MQW active layer 3 of the optical resonator formed by the reflection film 14 and the radiation-side reflection film 15 is reflected by the reflection film 14, and is emitted as a laser beam through the radiation-side reflection film 15. At this time, it is emitted while the wavelength is selected by the diffraction grating 13.

The semiconductor laser device 20 in the first embodiment is based on a precondition that it is used as an excitation light source of the Raman amplifier. The oscillation wavelength $\lambda o$ is 1100 nm to 1550 nm, and the resonator length L is from 800 $\mu$m to 3200 $\mu$m inclusive. In general, a mode interval $\Delta\lambda$ of a longitudinal mode generated by the resonator of the semiconductor laser device can be expressed in the following equation:

$$\Delta\lambda = \lambda o^2/(2 \cdot n \cdot L)$$

wherein an effective refractive index is "n". Assume that the oscillation wavelength $\lambda o$ is 1480 $\mu$m, and the effective refractive index is 3.5. Then, the mode interval $\Delta\lambda$ of the longitudinal mode is about 0.39 nm, when the resonator length L is 800 $\mu$m, and the mode interval $\Delta\lambda$ of the longitudinal mode is about 0.1 nm when the resonator length L is 3200 $\mu$m. That is, as the resonator length L becomes large, the mode interval $\Delta\lambda$ of the longitudinal mode becomes small, and the selection condition to oscillate the laser beam of a single longitudinal mode becomes strict.

On the other hand, the diffraction grating 13 selects a longitudinal mode based on a Bragg wavelength thereof. A selection wavelength characteristic of the diffraction grating 13 is expressed as an oscillation wavelength spectrum 30 shown in FIG. 4.

Figure 4:
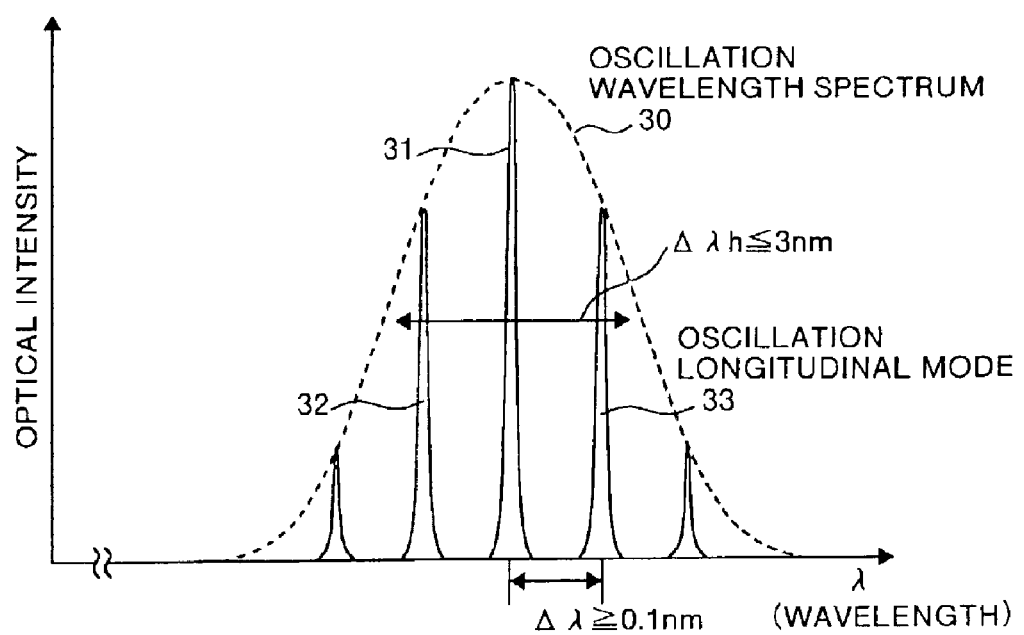
FIG. 4 is a diagram that shows a relation between an oscillation wavelength spectrum and an oscillation longitudinal mode of the semiconductor laser device shown in FIG. 1.
Figure 7:
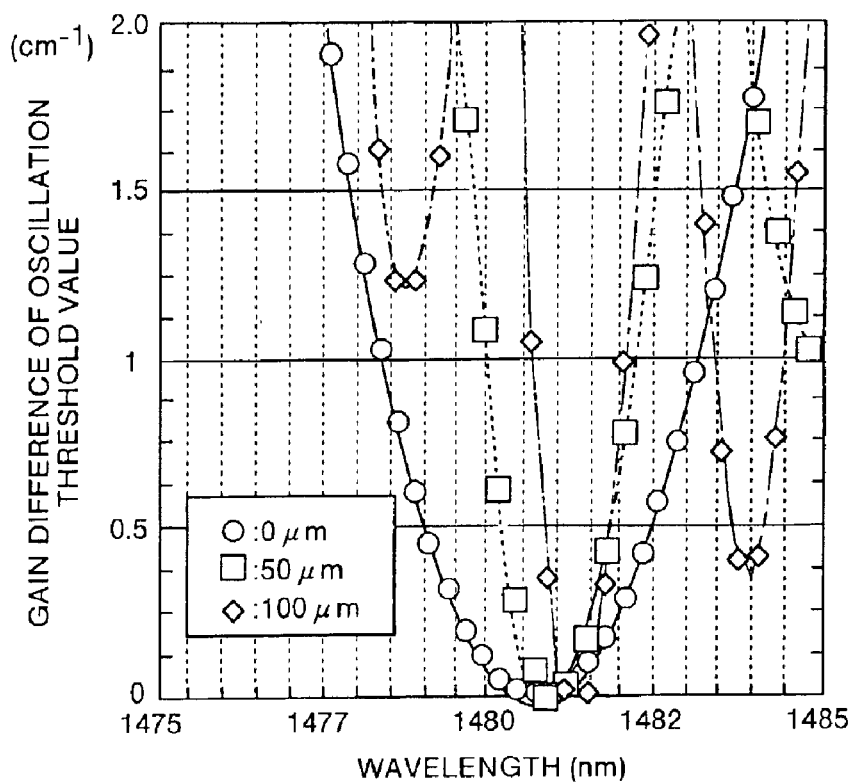
FIG. 7 is a diagram that shows a wavelength dependency of a gain difference of an oscillation threshold value, using an isolation distance of a diffraction grating from a radiation-side end surface as a parameter.

As shown in FIG. 4, in the first embodiment, a plurality of oscillation longitudinal modes are made to exist in a wavelength selection characteristic expressed by a half-width $\Delta\lambda h$ of the oscillation wavelength spectrum 30 by the semiconductor laser device 20 having the diffraction grating 13. In the conventional DBR (Distributed Bragg Reflector) semiconductor laser device or DFB (Distributed Feedback) semiconductor laser device, when the resonator length L is set to 800 $\mu$m or more, a single longitudinal mode oscillation is difficult. Therefore, a semiconductor laser device having such a resonator length L has not been used. In the semiconductor laser device 20 of the first embodiment, however, by positively setting the resonator length L to 800 $\mu$m or more, a laser beam is output while including a plurality of oscillation longitudinal modes in the half-width $\Delta\lambda h$ of the oscillation wavelength spectrum. In FIG. 7, three oscillation longitudinal modes 31 to 33 are included in the half-width $\Delta\lambda h$ of the oscillation wavelength spectrum.

Figure 5A:
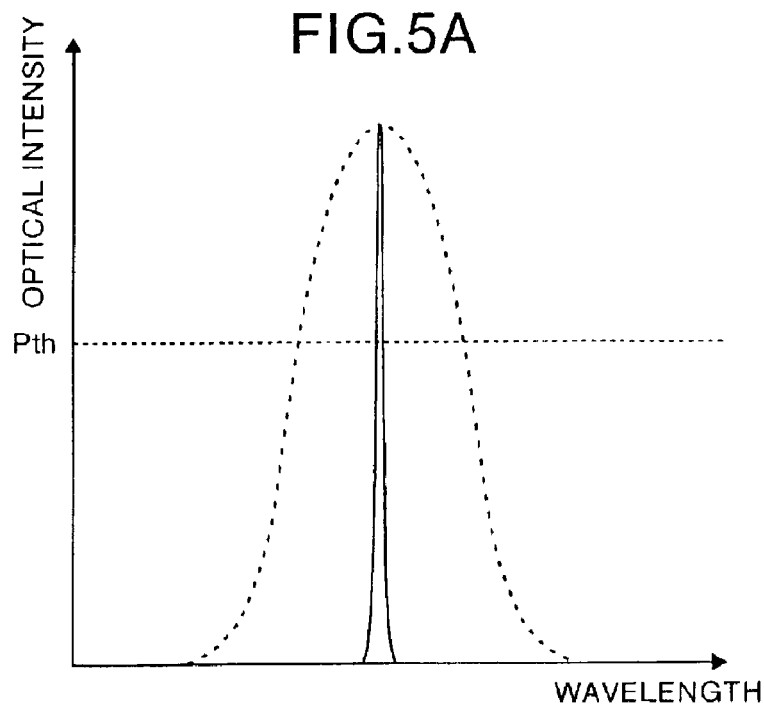
FIG. 5A and FIG. 5B are diagrams that shows a relation of laser beam output power between a single oscillation longitudinal mode and a plurality of oscillation longitudinal modes, and that shows a threshold value of induced Brillouin scattering.

When a laser beam having a plurality of oscillation longitudinal modes is used, it is possible to suppress a peak value of the laser output and obtain a high laser output value as compared with when a laser beam of single longitudinal mode is used. For example, the semiconductor laser device shown in the first embodiment has a profile shown in FIG. 5B, and can obtain a high laser output with a low peak value. Whereas, FIG. 5A shows a profile of a semiconductor laser device that has a single longitudinal mode oscillation when the same laser output is obtained, and this has a high peak value.

Figure 5B:
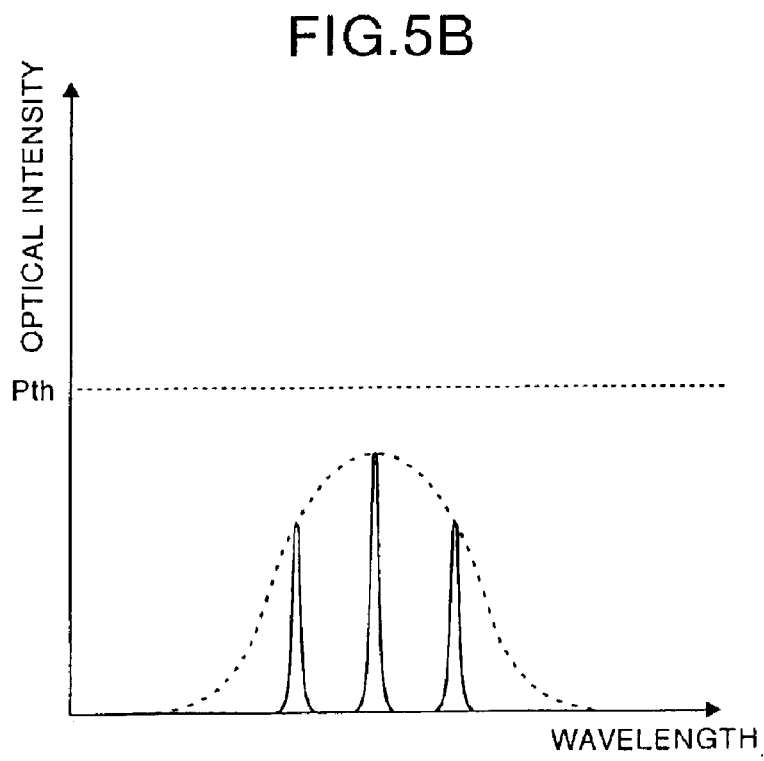

When the semiconductor laser device is used as an excitation light source for the Raman amplifier, it is preferable to increase an exciting optical output power in order to increase a Raman gain. However, when the peak value is high, there is a problem in that induced Brillouin scattering occurs and noise increases. Occurrence of the induced Brillouin scattering has a threshold value Pth at which the induced Brillouin scattering occurs. In order to obtain the same laser output power, as shown in FIG. 5B, a high exciting optical output power can be obtained within the threshold value Pth of the induced Brillouin scattering, by providing a plurality of oscillation longitudinal modes to suppress the peak value thereof. As a result, it becomes possible to obtain a high Raman gain.

The wavelength interval (mode interval) $\Delta\lambda$ between the oscillation longitudinal modes 31 to 33 is 0.1 nm or higher. This is because when the semiconductor laser device 20 is used as an excitation light source for the Raman amplifier, the probability that the induced Brillouin scattering occurs becomes high, when the mode interval $\Delta\lambda$ is 0.1 nm or less. As a result, it is preferable that the above-described resonator length L is 3200 $\mu$m or less according to the above-described equation of the mode interval $\Delta\lambda$.

From the above viewpoint, it is preferable that a plurality of oscillation longitudinal modes are included in the half-width $\Delta\lambda h$ of the oscillation wavelength spectrum 30. In the Raman amplification, as the amplified gain has a polarization dependency, it is necessary to reduce an influence due to a deviation between the polarization direction of the signal light and the polarization direction of the exciting light. For this purpose, there are methods of depolarizing the exciting light. More specifically, there are two methods. One method is to polarization-synthesize the output lights from two semiconductor laser devices 20 with a polarization beam combiner. The other method is to use a polarization maintaining fiber having a predetermined length as a depolarizer, to propagate the laser beam emitted from one semiconductor laser device 20 to the polarization maintaining fiber. When the latter method is used as a method for depolarization, coherence of the laser beam becomes lower as the number of oscillation longitudinal mode increases. Therefore, it is possible to shorten the length of the polarization maintaining fiber required for depolarization. Particularly, when the number of oscillation longitudinal mode is four or five, the required length of the polarization maintaining fiber becomes remarkably short. Therefore, when a laser beam emitted from the semiconductor laser device 20 is to be depolarized for use in the Raman amplifier, it becomes easy to utilize a laser beam emitted from one semiconductor laser device 20 by depolarizing it, without utilizing by polarization synthesizing the emitted lights emitted of two semiconductor laser devices. As a result, the number of parts used for the Raman amplifier can be reduced, and the Raman amplifier can be made small.

When the oscillation wavelength spectrum width is excessively large, the coupling loss of the wavelength synthesizing coupler becomes large, and noise and gain fluctuations occur due to the change of the wavelength in the oscillation wavelength spectrum width. Therefore, it is necessary to make the half-width $\Delta\lambda h$ of the oscillation wavelength spectrum 30 to 3 nm or less, and more preferably, 2 nm or less.

Figure 23:
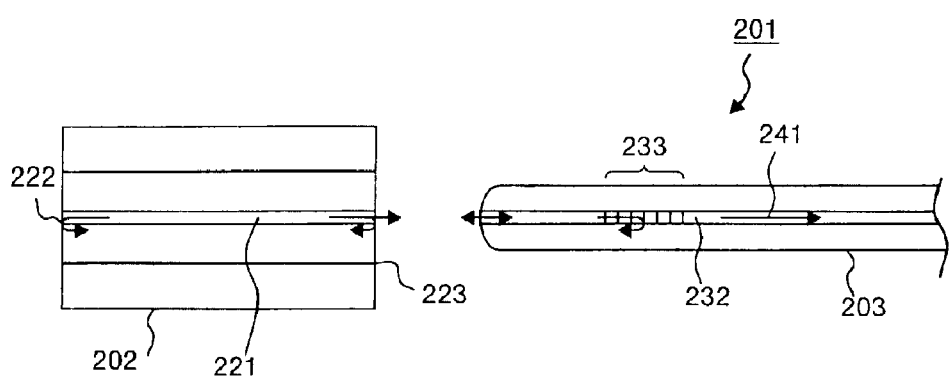
FIG. 23 is a diagram that shows a structure of a semiconductor laser module used for the Raman amplifier shown in FIG. 22.

As shown in FIG. 23, the conventional semiconductor laser device has been used as a semiconductor laser module using a fiber grating. Therefore, a relative intensity noise (RIN) increases due to the resonance between the fiber grating 233 and the light reflection surface 222. Consequently, it has not been possible to stably carry out Raman amplification. However, according to the semiconductor laser device 20 shown in the first embodiment, a laser beam emitted from the radiation-side reflection film 15 is directly used as an excitation light source for the Raman amplifier, without using the fiber grating 233. The relative intensity noise is reduced, and fluctuations in the Raman gain decrease, as a result. Therefore, it is possible to stably carry out the Raman amplification.

In the semiconductor laser module shown in FIG. 23, as mechanical coupling is required in the resonator, oscillation characteristic of the laser may vary due to vibrations or the like. In the semiconductor laser device of the first embodiment, however, oscillation characteristic of the laser does not change due to the mechanical vibration or the like, and it is possible to obtain a stable optical output.

Figure 6:
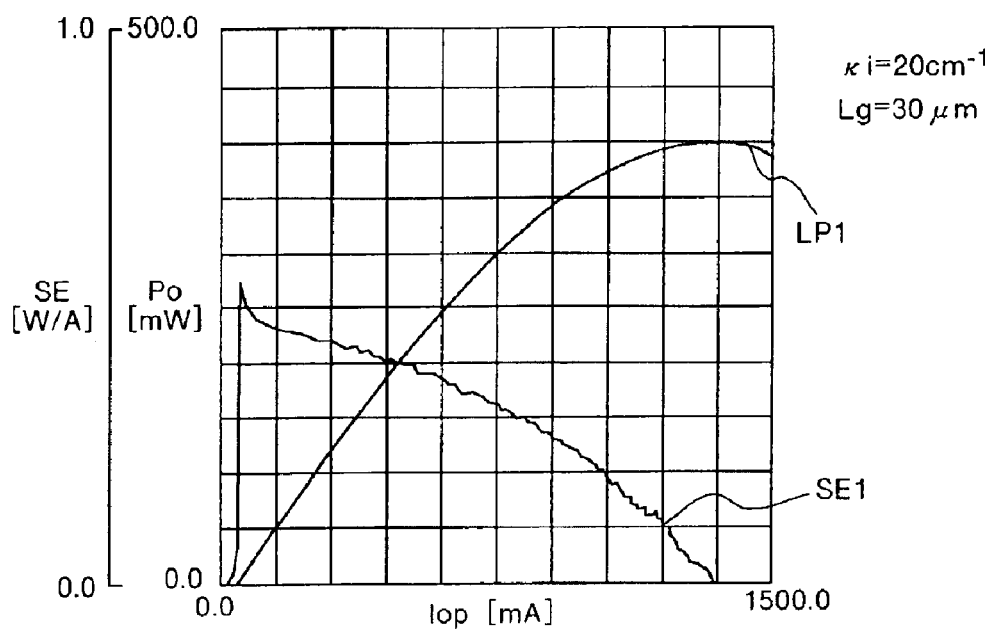
FIG. 6 is a diagram that shows an I–L characteristic of the semiconductor laser device of the first embodiment of the invention.

FIG. 6 is a diagram that shows an I-L (an optical output Po to a driving current Iop) characteristic when ki=20 cm$^{-1}$, and Lg=30 $\mu$m. In this I–L characteristic, a large kink does not occur in a range from several dozens of mA to about 1500 mA, and it is possible to obtain a high output of about 400 mW and carry out a high-efficiency operation when the driving current Iop is near 1200 mA.

An isolation distance Ls from the radiation-side end surface of the diffraction grating 13 in this first embodiment will be considered. The isolation distance Ls from the radiation-side end surface of the diffraction grating 13 has been studied for three Ls, including 0 $\mu$m, 50 $\mu$m, and 100 $\mu$m, assuming the coupling coefficient ki=26.5 cm$^{-1}$, the diffraction grating length Lg=50 $\mu$m, and the resonator length L=1300 $\mu$m. FIG. 7 is a diagram that shows a wavelength dependency of a gain difference of an oscillation threshold value. In FIG. 7, there is a tendency that the bandwidth of the gain difference of an oscillation threshold value becomes small when the isolation distance Ls from the radiation-side end surface becomes large. This is considered because a resonator is formed between the radiation-side end surface and the diffraction grating 13, and between the diffraction grating 13 and the reflection-side end surface, respectively, the composite resonators are formed.

Further, assume that a plurality of longitudinal modes exist at 0.5 cm$^{-1}$ or below as a gain difference of an oscillation threshold value, in order to realize a stable longitudinal multi-mode oscillation. When the diffraction grating 13 is in contact with the radiation-side end surface (Ls=0 μm), there are thirteen modes. When Ls=50 μm and 100 μm, there are six modes. Particularly, when Ls=100 μm, two longitudinal modes appear near 1484 nm. This is considered because of the above-mentioned composite resonators. As a result, when Ls=100 μm, there is a high possibility of the occurrence of a kink attributable to a longitudinal mode hop when a high driving current flows. Therefore, it is preferable that the diffraction grating 13 is disposed without a gap on the radiation-side end surface.

Figure 8:
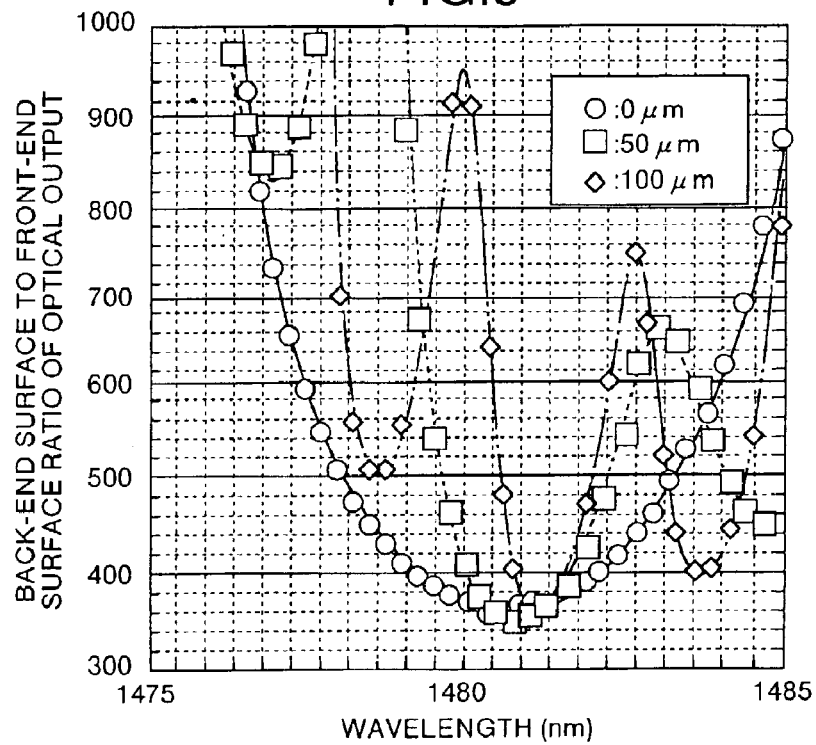
FIG. 8 is a diagram that shows a wavelength dependency of a back-end surface to front-end surface ratio of an optical output, using an isolation distance of a diffraction grating from a radiation-side end surface as a parameter.

FIG. 8 is a diagram that shows a wavelength dependency of a back-end surface to front-end surface ratio of an optical output, using a layout position of the diffraction grating as a parameter. In FIG. 8, the back-end surface to front-end surface ratio of an optical output in the oscillation mode is about 350 regardless of the position of the diffraction grating 13. However, the bandwidth becomes small, when the position of the diffraction grating 13 is isolated with an increasing distance from the radiation-side end surface. Consequently, it becomes difficult to carry out a stable longitudinal multi-mode oscillation. Therefore, from the results shown in FIG. 7 and FIG. 8, it is preferable that the isolation distance Ls of the diffraction grating 13 from the radiation-side end surface is less than 50 μm, more preferably, 0 μm.

On the other hand, when the laser temperature is high at large operation current, and also when the diffraction grating 13 is disposed without isolation from the radiation-side end surface, the refractive index of the diffraction grating 13 changes due to the heating. Consequently, it becomes impossible to secure high stability of oscillation wavelength. Therefore, based on the results of the observation of FIG. 7 and FIG. 8, the isolation distance Ls is optimum at about 10 to 20 μm. As a result, it becomes possible to secure a stable longitudinal multi-mode operation and wavelength stability. Therefore, the isolation distance Ls in FIG. 1 to FIG. 3 is set to 15 μm.

Figure 9:
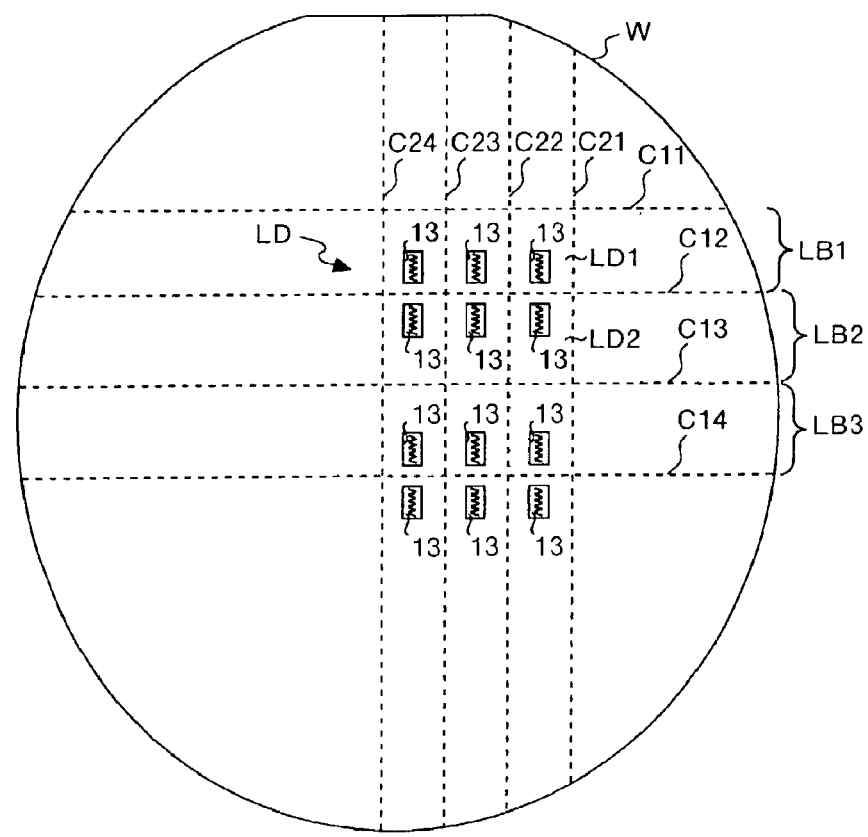
FIG. 9 is a plan view of a semiconductor wafer on which the semiconductor laser device shown in FIG. 1 is formed.

The respective semiconductor laser devices are collectively formed on a semiconductor wafer. FIG. 9 is a plan view of the semiconductor wafer on which the respective semiconductor laser devices are collectively formed. FIG. 10 is a partial cross-sectional view of the semiconductor wafer. In FIG. 9, diffraction gratings 13 are oppositely disposed and formed on a semiconductor laser device group LD comprising semiconductor laser devices LD1, LD2 and the like, and formed on the semiconductor wafer W. Therefore, even when a positional deviation occurs in a cleavage plane C12 between laser bars LB1 and LB2, the diffraction gratings 13 are formed within a range of an isolation distance Ls=10 to 20 μm from the radiation-side end surface, when the actually cleaved cleavage plane has a margin of ±5 μm. Further, even when a positional deviation occurs on the reflection-side end surface, the original function is not lost.

As the length Lg of this diffraction grating 13 is as short as 50 μm, it is possible to extremely shorten the time to draw the pattern of diffraction grating by an electronic beam lithography, regardless of the formation of the diffraction grating.

In the first embodiment, the isolation distance Ls of the diffraction grating 13 from the radiation-side end surface is set to 50 μm or less, particularly, 10 to 20 μm. With this, it is possible to secure high stability of oscillation wavelength, without the influence of variation in the refractive index of the diffraction grating due to the increase in the temperature of the end surface near the radiation-side end surface by the injection current. At the same time, it is possible to reduce the formation of composite resonators and the occurrence of the kink due to this formation. Therefore, it is possible to carry out a stable longitudinal multi-mode operation.

Further, the wavelength selection is carried out by the diffraction grating 13 of the semiconductor laser device 20, the oscillation wavelength is set to 1100 μm to 1550 μm band, and the resonator length L is set to 800 μm to 3200 μm band. Based on this, a laser beam having a plurality of oscillation longitudinal modes, preferably three or more, and more preferably four or more oscillation longitudinal modes are output into the half-width Δλh of the oscillation wavelength spectrum 30. Therefore, when used as the excitation light source for the Raman amplifier, it is possible to obtain a high Raman gain stably without generating the induced Brillouin scattering.

The optical coupling of the optical fiber having the fiber grating with the semiconductor light emission element is not performed in the resonator, like the semiconductor laser module using the fiber grating. Therefore, assembly becomes easy, and an unstable output caused by mechanical vibrations or the like can be avoided.

In the above-described first embodiment, the diffraction grating 13 outputs a plurality of oscillation longitudinal modes according to the wavelength selectivity having fluctuations with respect to a central wavelength. However, the fluctuations may positively be given to the diffraction grating 13, thereby to obtain a semiconductor laser device capable of increasing the number of oscillation longitudinal modes.

Figure 12:
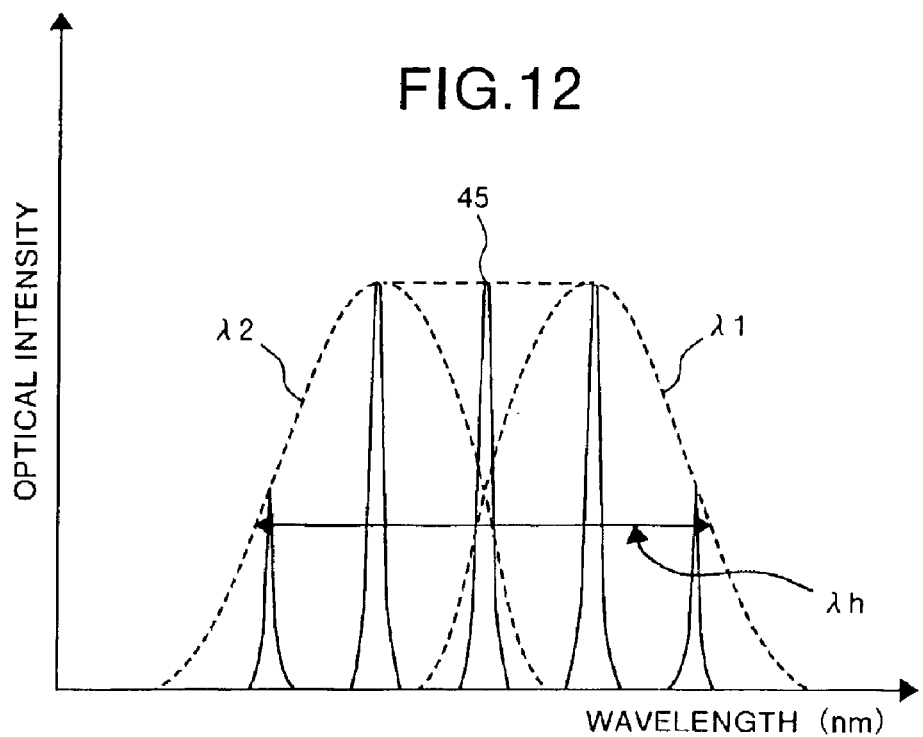
FIG. 12 is a diagram that shows an oscillation wavelength spectrum when the chirped grating is applied to the diffraction grating.

FIG. 11 is a diagram that shows a periodical variation in the grating period of the diffraction grating 13. The diffraction grating 13 is a chirped grating having the grating period changed periodically. In FIG. 12, fluctuations are generated in the wavelength selectivity of the diffraction grating 13, and the half-width Δλh of the oscillation wavelength spectrum is enlarged, so that the number of oscillation longitudinal modes in the half-width Δλh is increased.

As shown in FIG. 11, the diffraction grating 13 has a structure in which the average period is 220 nm, and periodic fluctuations (deviation) of ±0.02 nm are repeated in a cycle C. With the periodic fluctuations of ±0.02 nm, three to six oscillation longitudinal modes can be provided in the half-width Δλh of the oscillation wavelength spectrum.

For example, FIG. 12 is a diagram that shows an oscillation wavelength spectrum of a semiconductor laser device having diffraction gratings of different periods $\Lambda_1$ and $\Lambda_2$. In FIG. 12, the diffraction grating of the period $\Lambda_1$ forms an oscillation wavelength spectrum of a wavelength λ1, and three oscillation longitudinal modes are selected in the oscillation wavelength spectrum. On the other hand, the diffraction grating of the period $\Lambda_2$ forms an oscillation wavelength spectrum of a wavelength $\lambda_2$, and three oscillation longitudinal modes are selected in the oscillation wavelength spectrum. Therefore, a compound oscillation wavelength spectrum 45 according to the diffraction gratings of the periods $\Lambda_1$ and $\Lambda_2$ includes four to five oscillation longitudinal modes in the compound oscillation wavelength spectrum 45. As a result, it is easily possible to selectively output more oscillation longitudinal modes than when a single oscillation wavelength spectrum is formed. Therefore, it is possible to increase the optical output.

The structure of the diffraction grating 13 is not limited to the chirped grating in which the grating period is changed in the given cycle C. The grating period may be changed at random between the period $\Lambda_1$ (220 nm+0.02 nm) and the period $\Lambda_2$ (220 nm−0.02 nm).

Figure 13A:
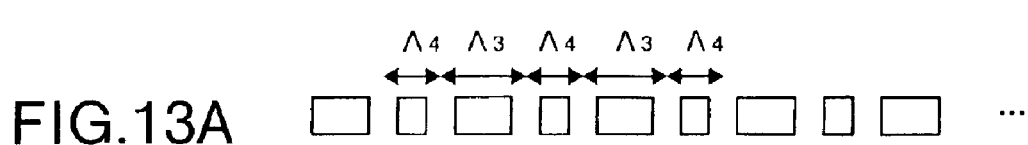
FIG. 13A to FIG. 13C are diagrams that shows a modification example of a grating having periodic fluctuations.
Figure 13B:
Figure 13C:
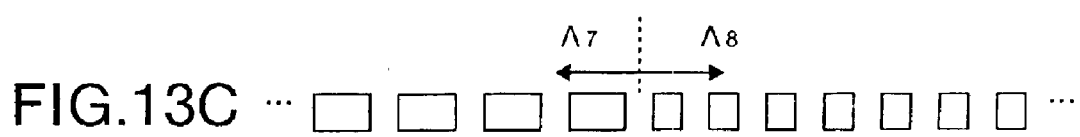

Further, as shown in FIG. 13A, the diffraction grating may have periodic fluctuations, as such that alternately repeats a period $\Lambda_3$ and a period $\Lambda_4$ that are different one by one. Further, as shown in FIG. 13B, the diffraction grating may have periodic fluctuations, as such that alternately repeats a period $\Lambda_5$ and a period $\Lambda_6$ that are different, each by a plurality of times. Further, as shown in FIG. 13C, the diffraction grating may have periodic fluctuations, as such that has a plurality of continuous periods $\Lambda_7$ and a plurality of periods $\Lambda_8$ that are continued at different periods from the period $\Lambda_7$. Periods having different discrete values respectively may be complemented between the periods $\Lambda_3, \Lambda_5, \Lambda_7$ and periods $\Lambda_4, \Lambda_6, \Lambda_8$, to thereby carry out arrangements which change the period stepwise.

(Second Embodiment)

A second embodiment of the invention will now be explained. In the second embodiment, the semiconductor laser device shown in the above-described first embodiment is modularized.

FIG. 14 is a longitudinal sectional view that shows a structure of a semiconductor laser module of the second embodiment of the invention. In FIG. 14, a semiconductor laser module 50 includes a semiconductor laser device 51 corresponding to the semiconductor laser device shown in the above-described first to third embodiments. The semiconductor laser device 51 is of a junction-down structure in which a p-side electrode is connected to a heat sink 57a. A Peltier element 58 as a temperature control device is disposed on a bottom surface inside a package 59 formed of ceramic as a housing of the semiconductor laser module 50. A base 57 is disposed on the Peltier element 58, and the heat sink 57a is disposed on the base 57. Current (not shown) is supplied to the Peltier element 58, and cooling and heating is performed based on the polarity thereof. In order to prevent the occurrence of a deviation in the oscillation wavelength due to a rise in the temperature of the semiconductor laser device 51, the Peltier element 58 functions mainly as a cooler. That is, when the laser beam has a wavelength longer than a desired wavelength, the Peltier element 58 cools and controls the temperature to be low. When the laser beam has a wavelength shorter than the desired wavelength, the Peltier element 58 heats and controls the temperature to be high. To be specific, this temperature control is controlled based on a detection value of a thermistor 58a disposed on the heat sink 57a near the semiconductor laser device 51. The control device (not shown) usually controls the Peltier element 58 such that the temperature of the heat sink 57a is maintained constant. The control device (not shown) also controls the Peltier element 58 such that the temperature of the heat sink 57a decreases as the driving current of the semiconductor laser device 51 is increased. By performing such a temperature control, it is possible to improve the output stability of the semiconductor laser device 51, and this is also effective for improving the yield. It is preferable to form the heat sink 57a of a material having high thermal conductivity such as diamond. This is because heat generation at high operation current is suppressed, when the heat sink 57a is formed of diamond.

The heat sink 57a on which the semiconductor laser device 51 and the thermistor 58a are arranged, a first lens 52, and a photo-current monitor 56 are disposed on the base 57. A laser beam emitted from the semiconductor laser device 51 is guided onto an optical fiber 55 through the first lens 52, an isolator 53 and a second lens 54. The second lens 54 is provided on a package 59 on an optical axis of the laser beam, and is optically coupled with the optical fiber 55 that is externally connected. The current monitor 56 monitors and detects light leaked from the reflection film side of the semiconductor laser device 51.

In the semiconductor laser module 50, the isolator 53 is interposed between the semiconductor laser device 51 and the optical fiber 55 so that the reflected return light caused by other optical part does not return into the resonator. As this isolator 53, an isolator of a polarization dependent type which can be incorporated in the semiconductor laser module 50, can be used instead of the in-line fiber type, unlike the conventional semiconductor laser module using the fiber grating. Therefore, an insertion loss caused by the isolator can be reduced, further lower relative intensity noise (RIN) can be achieved, and the number of parts can be reduced.

In the second embodiment, the semiconductor laser device shown in the first embodiment is modularized. Therefore, the polarization dependent type isolator can be used, and hence the insertion loss can be reduced, the noise and the number of parts can be further reduced.

(Third Embodiment)

Next, a third embodiment of the present invention will be explained. In the third embodiment, the semiconductor laser module shown in the second embodiment is applied to the Raman amplifier.

Figure 15:
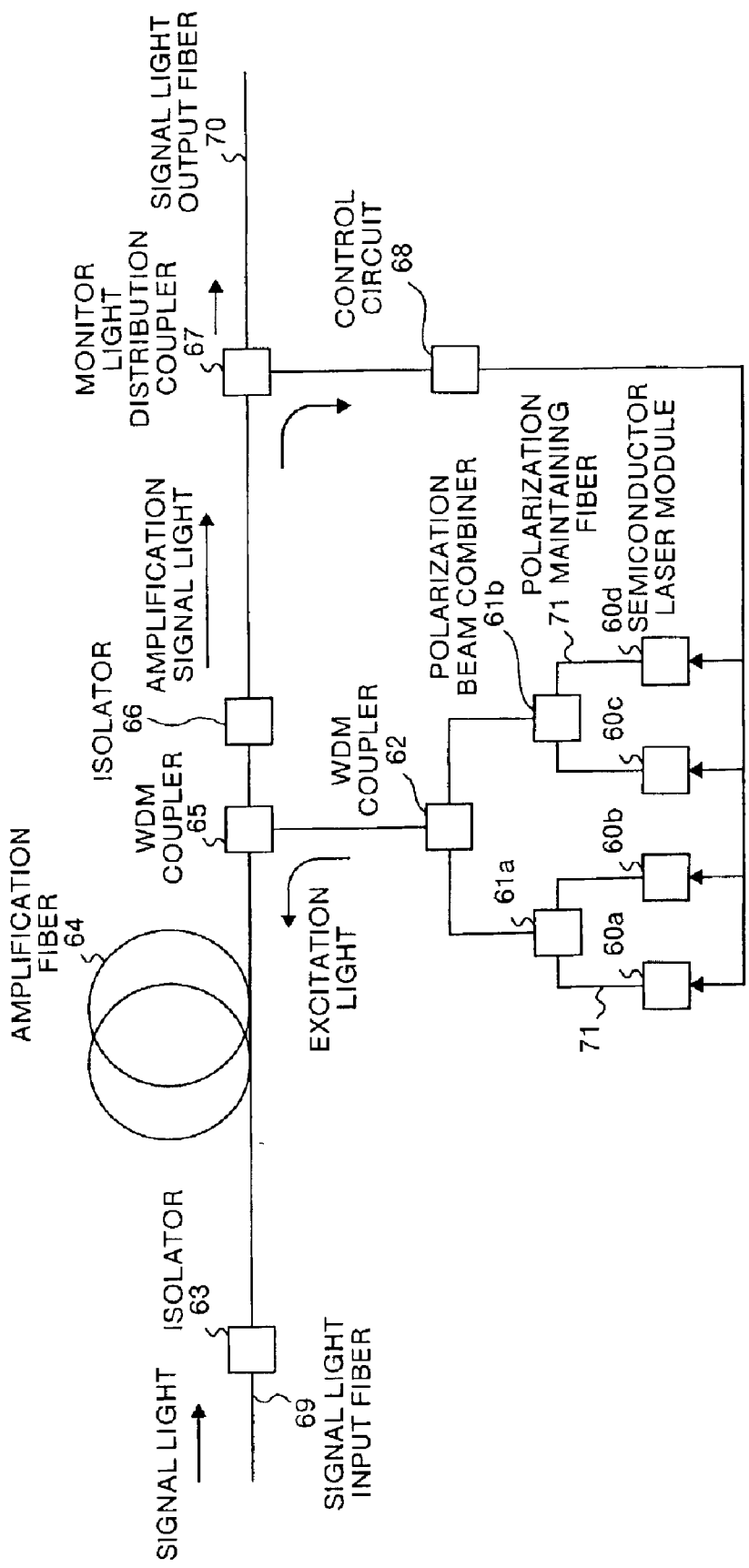
FIG. 15 is a block diagram that shows a structure of a Raman amplifier of a third embodiment of the invention.
Figure 22:
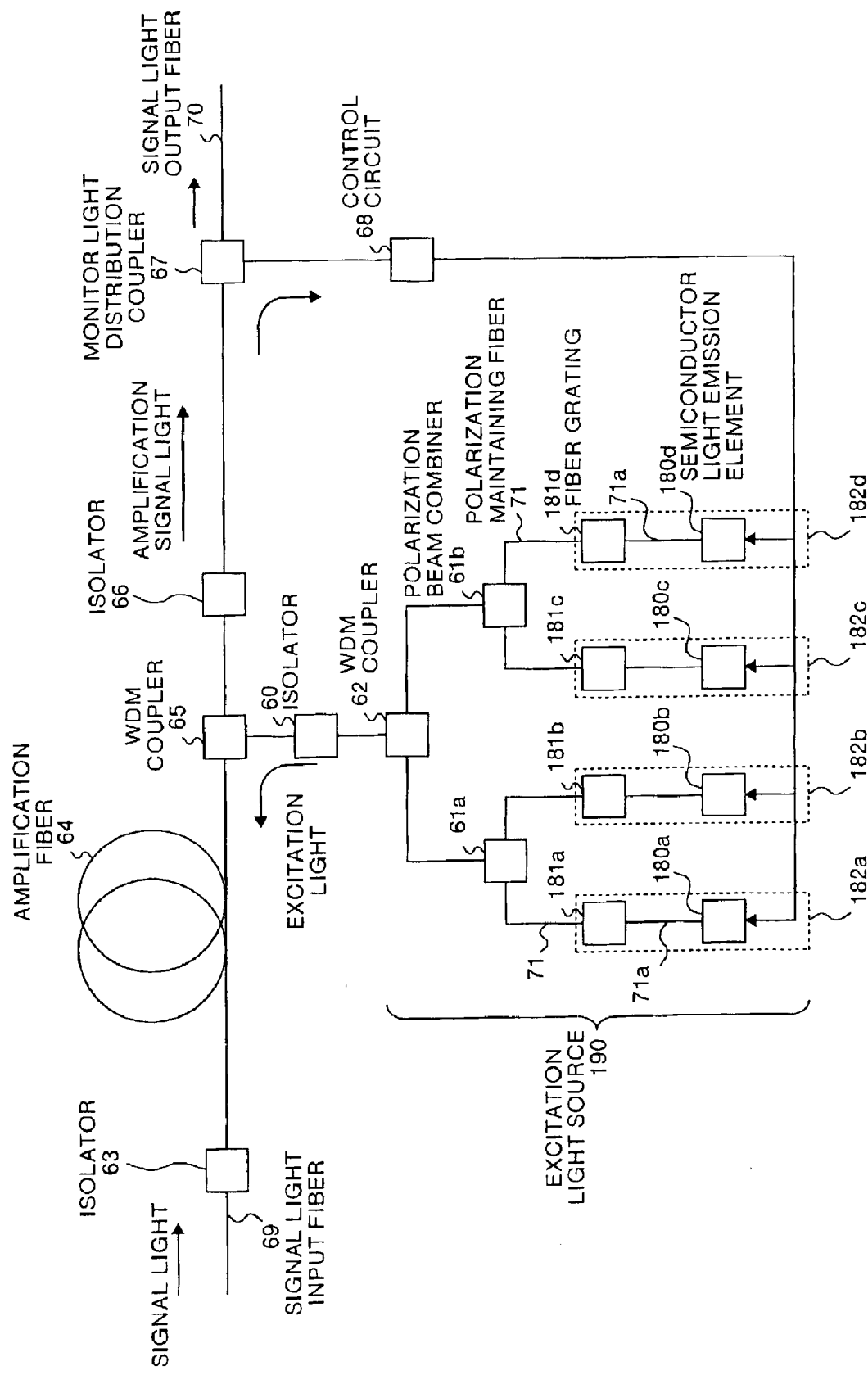
FIG. 22 is a block diagram that shows a schematic structure of a conventional Raman amplifier.

FIG. 15 is a block diagram that shows a structure of a Raman amplifier of the third embodiment of the invention. The Raman amplifier is used for the WDM communication system. In FIG. 15, the Raman amplifier uses semiconductor laser modules 60a to 60d having the same structure as that of the semiconductor laser module shown in the second embodiment, and it is of a structure such that semiconductor laser modules 182a to 182d shown in FIG. 22 are replaced by the above-described semiconductor laser modules 60a to 60d.

Each of the semiconductor laser modules 60a and 60b outputs a laser beam having a plurality of oscillation longitudinal modes to the polarization beam combiner 61a through a polarization maintaining fiber 71. Each of the semiconductor laser modules 60c and 60d outputs a laser beam having a plurality of oscillation longitudinal modes to the polarization beam combiner 61b through the polarization maintaining fiber 71. The laser beams oscillated by the semiconductor laser modules 60a and 60b have the same wavelengths. The laser beams oscillated by the semiconductor laser modules 60c and 60d have the same wavelengths, but different from the wavelengths of the laser beams oscillated by the semiconductor laser modules 60a and 60b. This is because the Raman amplification has a polarization dependency, and the laser beams are output, after the polarization dependency is eliminated by the polarization beam combiners 61a and 61b.

The laser beams having different wavelengths output from the polarization beam combiners 61a and 61b are multiplexed by a WDM coupler 62. The multipexed laser beam is output to an amplification fiber 64 as an exciting light for the Raman amplification through a WDM coupler 65. A signal light to be amplified is input to the amplification fiber 64 to which the exciting light has been input, and is Raman-amplified.

The signal light (amplified signal light) which has been Raman-amplified in the amplification fiber 64 is input to a monitor light distribution coupler 67 through the WDM coupler 65 and an isolator 66. The monitor light distribution coupler 67 outputs a portion of the amplified signal light to a control circuit 68, and outputs the remaining amplified signal light to a signal optical output fiber 70 as output laser beam.

The control circuit 68 controls the laser output state of the semiconductor laser modules 60*a* to 60*d*, e.g., the optical intensity, based on a part of the input amplified signal light, and feedback controls so that the gain band of the Raman amplification has a flat characteristic.

In the Raman amplifier shown in the third embodiment, a semiconductor laser module 182*a* in which a semiconductor light emission element 180*a* and a fiber grating 181*a* are coupled by a polarization maintaining fiber 71*a*, for example as shown in FIG. 22, is not used. Instead, there is used the semiconductor laser module 60*a* in which the semiconductor laser device shown in the first to third embodiments is incorporated. Therefore, it is possible to reduce the use of the polarization maintaining fiber 71. At the same time, it is possible to realize reduction in size and weight of the Raman amplifier, and cost reduction.

Figure 16:
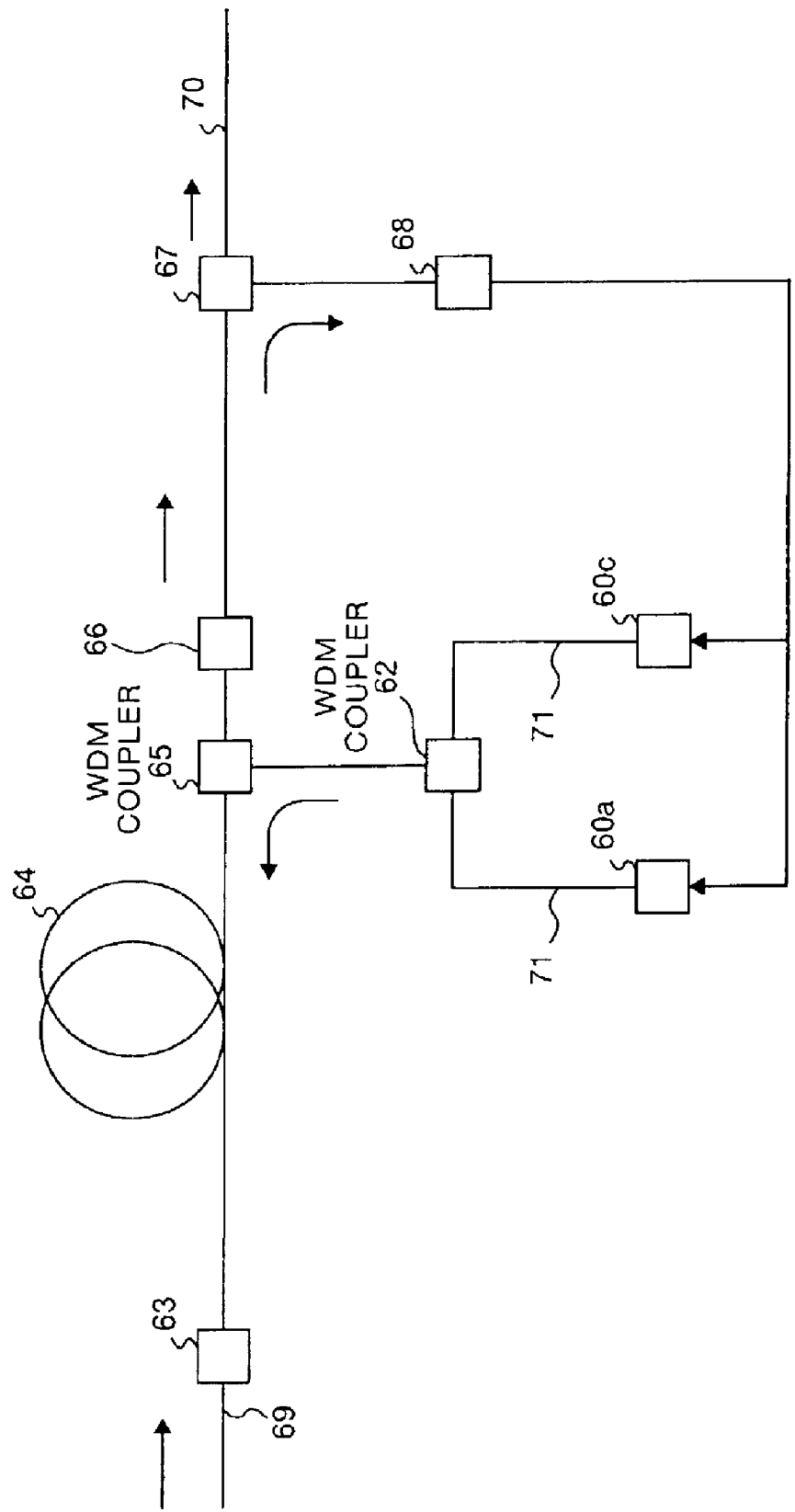
FIG. 16 is a block diagram that shows an application example of the Raman amplifier shown in FIG. 15.

The polarization beam combiners 61*a* and 61*b* are used in the Raman amplifier shown in FIG. 15. However, light may also be output directly to the WDM coupler 62 through the polarization maintaining fiber 71 from the semiconductor laser modules 60*a* and 60*c*, as shown in FIG. 16. Here, the plane of polarization of each of the semiconductor laser modules 60*a* and 60*c* is set to 45 degrees with respect to the polarization maintaining fiber 71. As described above, as each of the semiconductor laser modules 60*a* and 60*c* includes a plurality of oscillation longitudinal modes, it is possible to shorten the length of the polarization maintaining fiber 71. As a result, the polarization dependency in the optical output which is output from the polarization maintaining fiber 71 can be eliminated, and it is possible to realize a Raman amplifier which is smaller and has a smaller number of parts.

When a semiconductor laser device having a large number of oscillation longitudinal modes is used as a semiconductor laser device incorporated in the semiconductor laser modules 60*a* to 60*d*, it is possible to shorten the length of the required polarization maintaining fiber 71. Particularly, when the number of the oscillation longitudinal modes is four or five, the length of the required polarization maintaining fiber 71 is greatly shortened and hence, the Raman amplifier can further be simplified and reduced in size. Further, when the number of oscillation longitudinal modes is increased, the coherent length becomes short, the degree of polarization (DOP) is reduced by depolarization, and it is possible to decrease the polarization dependency. As a result, the Raman amplifier can be further simplified and reduced in size.

In this Raman amplifier, alignment of the optical axis is easy as compared with a semiconductor laser module using the fiber grating, and there is no mechanical optical coupling in the resonator. As a result, the stability and reliability of the Raman amplifier can be enhanced.

Further, as the semiconductor laser device of the above-described first embodiment includes a plurality of oscillation modes, it is possible to generate high-output exciting light without causing the induced Brillouin scattering. Therefore, it is possible to obtain high and stable Raman gain.

The Raman amplifier shown in FIGS. 15 and 16 is of a rear-side excitation method. However, as the semiconductor laser modules 60*a* to 60*d* output a stable exciting light as described above, it is possible to carry out stable Raman amplification irrespective of front-side excitation method or bi-directional excitation method.

Figure 17:
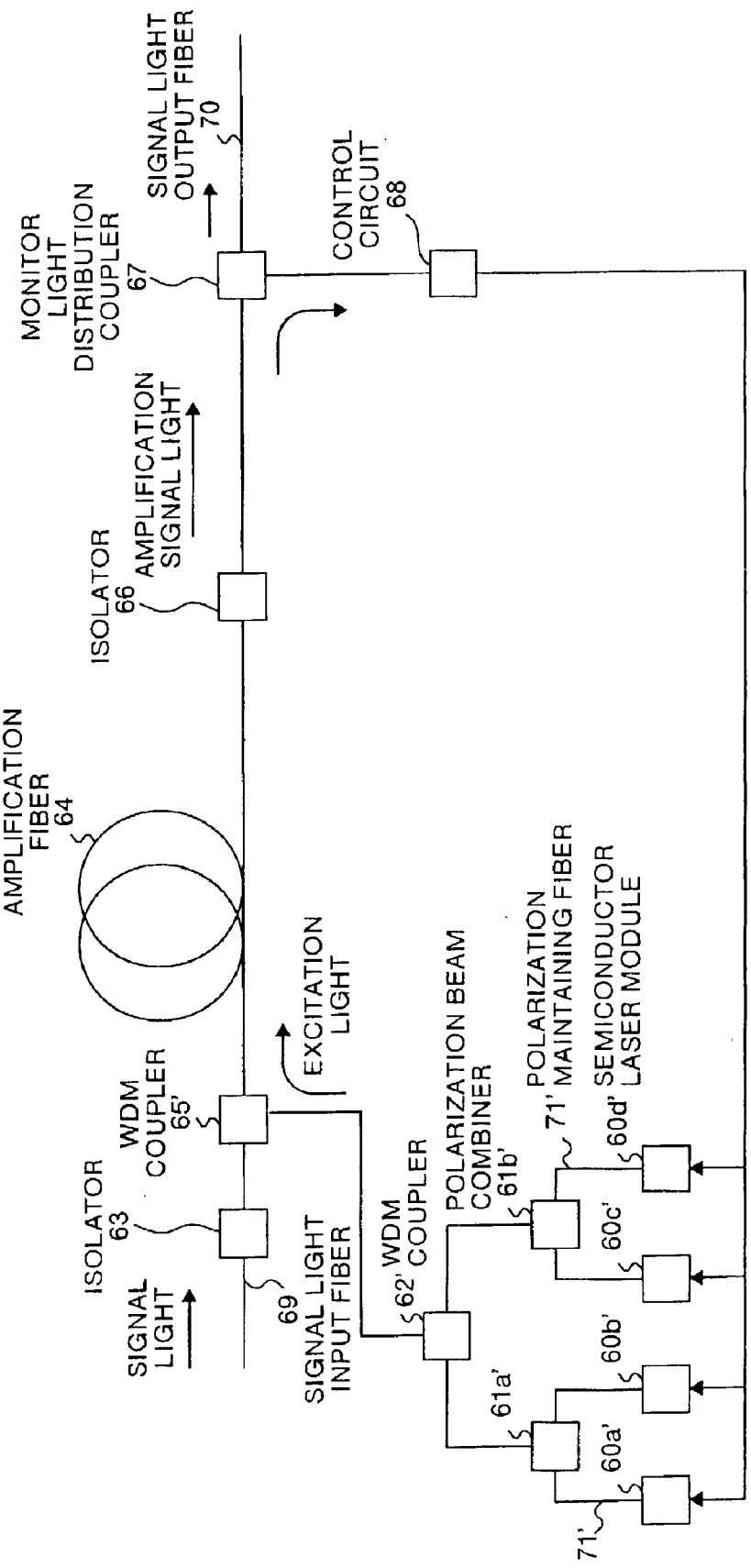
FIG. 17 is a block diagram that shows a modification example of the Raman amplifier shown in FIG. 15, and this shows a structure of the Raman amplifier employing a front-side excitation method.

FIG. 17 is a block diagram that shows a structure of the Raman amplifier employing the front-side excitation method, for example. In the Raman amplifier shown in FIG. 17, a WDM coupler 65' is provided near an isolator 63 in the Raman amplifier shown in FIG. 15. A circuit having semiconductor laser modules 60*a'* to 60*d'*, polarization beam combiners 61*a'* and 61*b'* and a WDM coupler 62' respectively corresponding to the semiconductor laser modules 60*a* to 60*d*, the polarization beam combiners 61*a* and 61*b* and the WDM coupler 62 is connected to the WDM coupler 65'. The front-side excitation is carried out in which the exciting light output from the WDM coupler 62' is output in the same direction as the signal light. Here, the semiconductor laser modules 60*a'* to 60*d'* use the semiconductor laser devices used in the first to forth embodiment. Therefore, it is possible to reduce the RIN, and to effectively carry out the front-side excitation.

Figure 18:
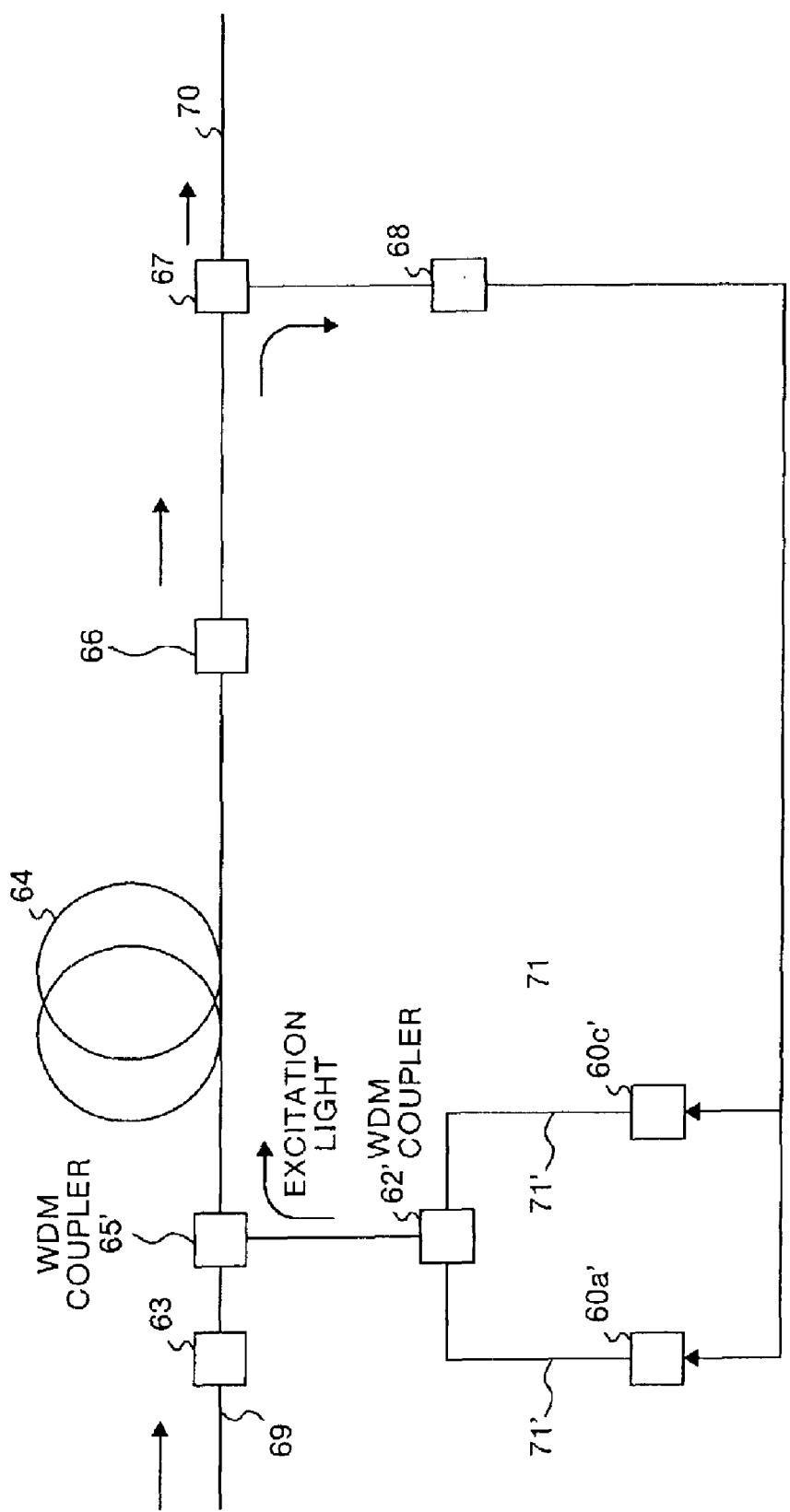
FIG. 18 is a block diagram that shows an application example of the Raman amplifier shown in FIG. 17.

Similarly, FIG. 18 is a block diagram that shows a structure of a Raman amplifier employing the front-side excitation method. In the Raman amplifier shown in FIG. 18, the WDM coupler 65' is provided in the vicinity of the isolator 63 in the Raman amplifier shown in FIG. 16. A circuit having semiconductor laser modules 60*a'* and 60*c'* and a WDM coupler 62' corresponding to the semiconductor laser modules 60*a* and 60*c* and the WDM coupler 62 respectively is connected to the WDM coupler 65'. The front-side excitation is carried out in which the exciting light output from the WDM coupler 62' is output in the same direction as the signal light. Here, the semiconductor laser modules 60*a'* and 60*c'* use the semiconductor laser devices used in the first embodiment. Therefore, it is possible to reduce the RIN, and it is possible to effectively carry out the front-side excitation.

Figure 19:
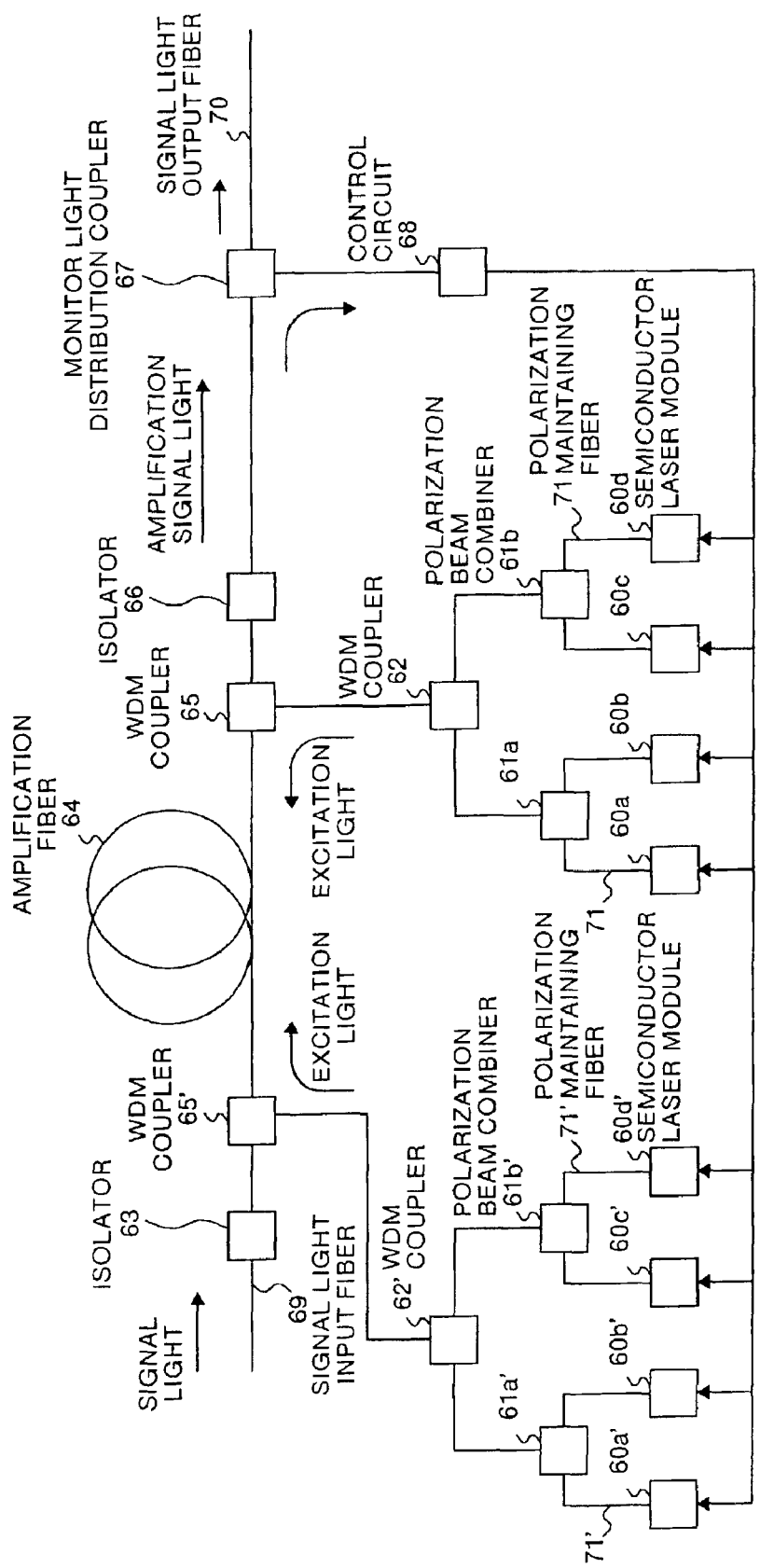
FIG. 19 is a block diagram that shows a modification example of the Raman amplifier shown in FIG. 15, and this shows a structure of the Raman amplifier employing a bi-directional excitation method.

FIG. 19 is a block diagram that shows a structure of a Raman amplifier employing the bi-directional excitation method. In the Raman amplifier shown in FIG. 19, the WDM coupler 65', the semiconductor laser modules 60*a'* to 60*d'*, the polarization beam combiners 61*a'* and 61*b'* and the WDM coupler 62' shown in FIG. 17 are further provided in the structure of the Raman amplifier shown in FIG. 15, thereby carrying out the rear-side excitation and front-side excitation. Here, the semiconductor laser modules 60*a'* to 60*d'* use the semiconductor laser devices used in the above-described first embodiment. Therefore, it is possible to reduce the RIN, and it is possible to effectively carry out the front-side excitation.

Figure 20:
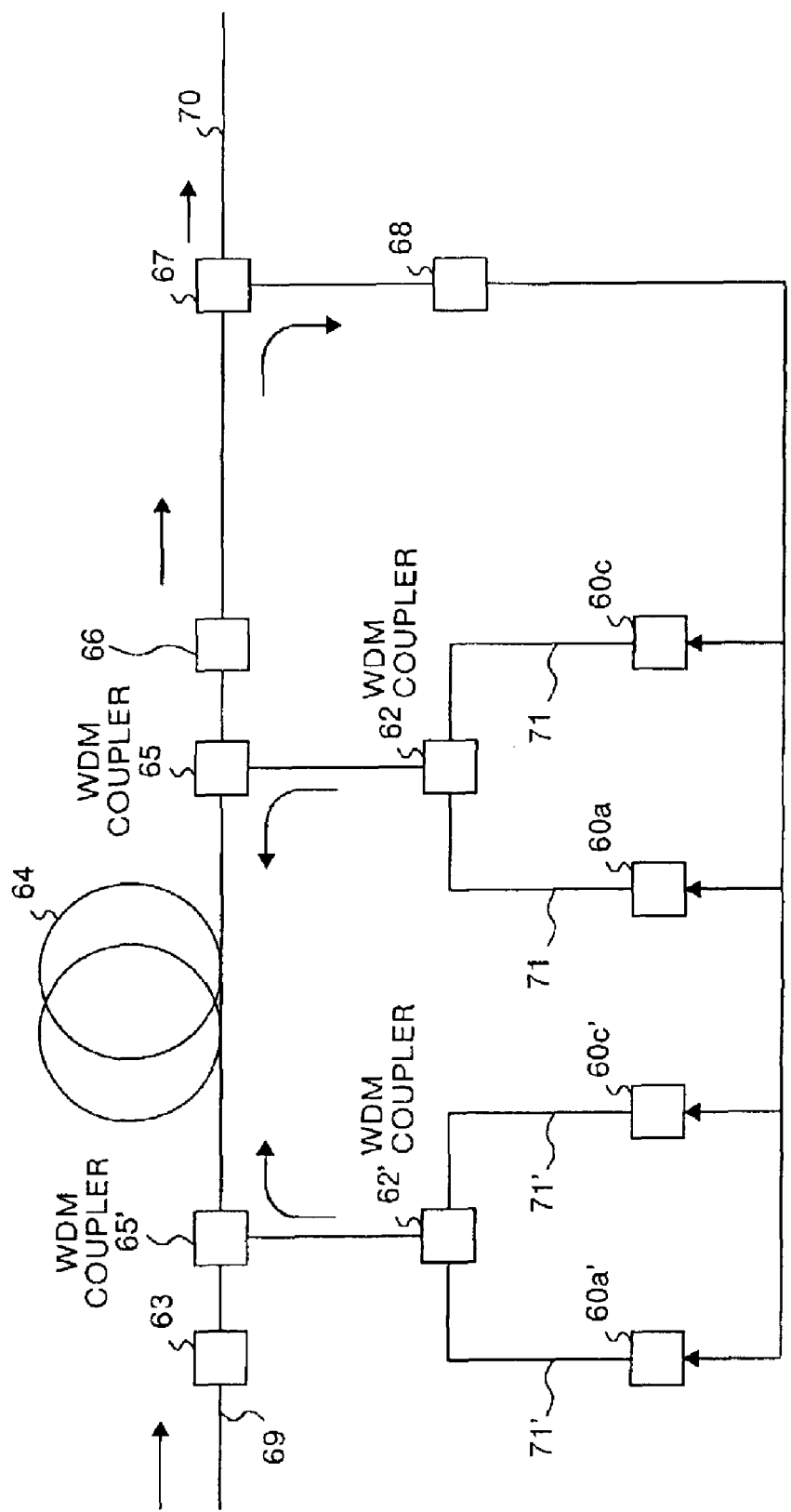
FIG. 20 is a block diagram that shows an application example of the Raman amplifier shown in FIG. 19.

Similarly, FIG. 20 is a block diagram that shows a structure of a Raman amplifier employing the bi-directional excitation method. In the Raman amplifier shown in FIG. 19, the WDM coupler 65', the semiconductor laser modules 60*a'* and 60*c'* and the WDM coupler 62' shown in FIG. 18 are further provided in the structure of the Raman amplifier shown in FIG. 16, thereby carrying out the rear-side excitation and front-side excitation. Here, the semiconductor laser modules 60*a'* and 60*c'* use the semiconductor laser devices used in the first to forth embodiment. Therefore, it is possible to reduce the RIN, and it is possible to effectively carry out the front-side excitation.

Figure 21:
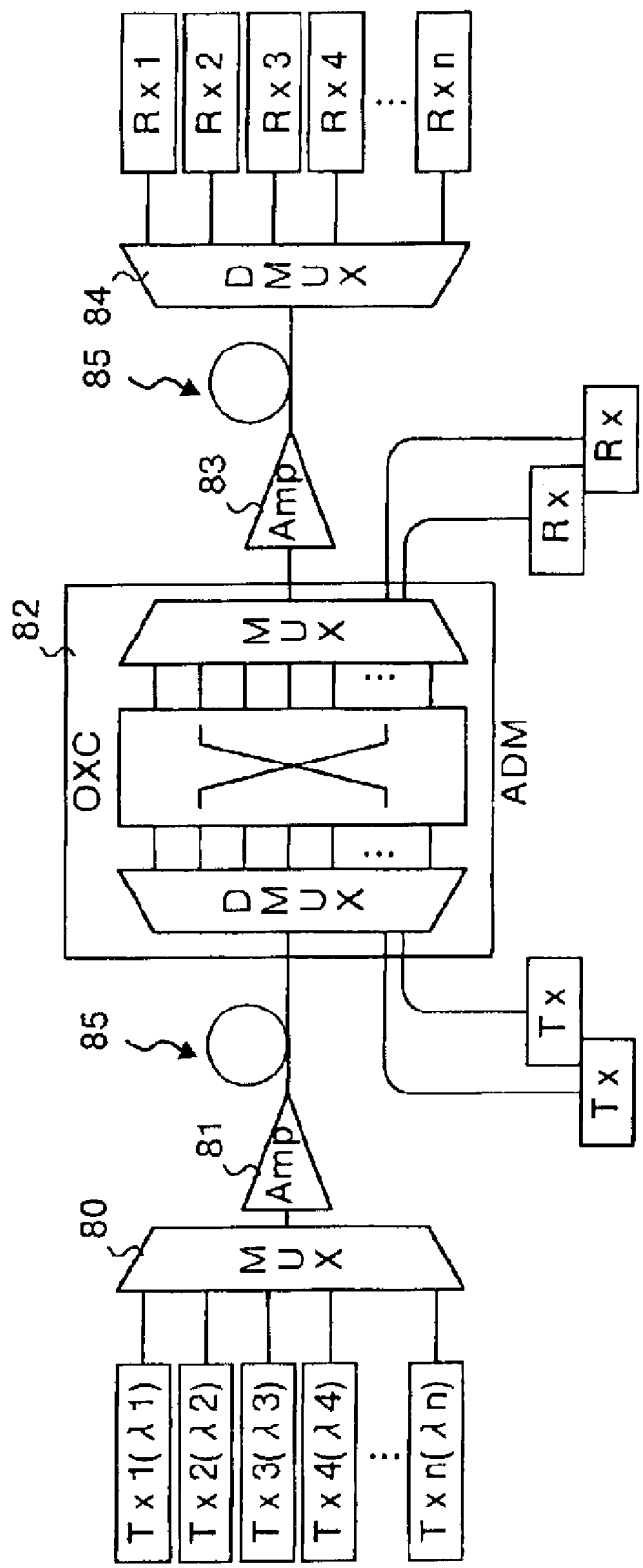
FIG. 21 is a block diagram that shows a schematic structure of a WDM communication system using the Raman amplifier shown in FIGS. 15 to 20.

As described above, the above-described Raman amplifier shown in FIGS. 17 to 20 can be applied to the WDM communication system. FIG. 21 is a block diagram that shows a schematic structure of the WDM communication system to which the Raman amplifier shown in FIGS. 17 to 20 is applied.

In FIG. 21, optical signals having wavelengths $\lambda_1$ to $\lambda_n$ transmitted from a plurality of transmitters Tx1 to Txn are coupled by an optical coupler 80, and are aggregated into one optical fiber 85. On a transmitting path of this optical fiber 85, a plurality of Raman amplifiers 81 and 83 corresponding to the Raman amplifier shown in FIGS. 17 to 20 are disposed depending upon the distance, thereby to amplify the attenuated optical signal. The signal transmitted on the optical fiber 85 is branched by an optical brancher 84 into optical signals having the plurality of wavelengths $\lambda_1$ to $\lambda_n$, and these are received by a plurality of receivers Rx1 to Rxn. An ADM (Add/Drop Multiplexer) which adds or drops an optical signal having an optional wavelength may be inserted in the optical fiber 85.

In the above-described third embodiment, the semiconductor laser device shown in the first embodiment, or the semiconductor laser module shown in the second embodiment is used as an excitation light source for the Raman amplification. However, it is not limited to this, and it is obvious that they can be also used as the EDFA excitation light source of 980 nm and 1480 nm, for example.

As explained above, according to the present invention, the diffraction grating is provided in the vicinity of the first reflection film, and is formed with an isolation of 50 μm or less from the first reflection film. Based on this isolation, it is possible to eliminate unstableness in the wavelength generated following the variation in the refractive index of the diffraction grating due to the increase in the temperature of the end surface of the first reflection film. At the same time, it is possible to avoid kink attributable to the oscillation longitudinal mode hopping and to realize a stable longitudinal multi-mode oscillation, based on the isolation of not exceeding 50 μm. Therefore, there is an effect that it is possible to realize high stability of oscillation and a stable longitudinal multi-mode operation.

According to the present invention, the isolation distance of the diffraction grating from the first reflection film is set to a range of 10 to 20 μm. Therefore, there is an effect that it is possible to realize high stability of oscillation and a stable longitudinal multi-mode operation.

According to the present invention, two or more of the desired oscillation longitudinal modes are included in the half-width of the oscillation wavelength spectrum, based on the wavelength selection characteristic of the diffraction grating. With this arrangement, a high-output laser beam is output. Therefore, there is an effect that even when the semiconductor laser device has a high output, it is possible to stably and efficiently output the oscillation wavelength selected by the diffraction grating.

According to the present invention, the diffraction grating provided on the side of the first reflection film has a diffraction grating length of 300 μm or less. Therefore, there is an effect that two or more oscillation longitudinal modes can be easily generated, and the optical output efficiency can be improved.

According to the present invention, the diffraction grating provided on the side of the first reflection film has a diffraction grating length less than a value of (300/1300) times the resonator length. Therefore, there is an effect that even when the resonator has an optional length, two or more oscillation longitudinal modes can be easily generated, and the optical output efficiency of high output can be improved.

According to the present invention, the multiplication value of the diffraction grating obtained by multiplying a coupling coefficient of the diffraction grating by the diffraction grating length is 0.3 or less. Therefore, the linearity of the driving current-optical output characteristic becomes excellent, and the stability of the optical output is enhanced. As a result, there is an effect that it is possible to reduce the driving current dependency of the oscillation wavelength, and it is possible to realize a semiconductor laser device having high output stability.

According to the present invention, the grating period of the diffraction grating is varied at random or in a predetermined cycle, so that fluctuations are made to occur in the wavelength selection of the diffraction grating, and the half-width of the oscillation wavelength spectrum is widened. Therefore, there is an effect that it is possible to easily increase the number of oscillation longitudinal modes included in the half-width of the oscillation wavelength spectrum, and it is possible to realize a stable and highly efficient semiconductor laser device.

According to the present invention, the length of the resonator formed by the active layer formed between the first reflection film and the second reflection film is 800 μm or more, and high output operation is realized. Therefore, there is an effect that it is possible to realize high output operation, and stably and highly efficiently output oscillation wavelength selected by the diffraction grating.

According to the present invention, the semiconductor laser device which does not use the fiber grating is used, and the resonator of the semiconductor laser device is not physically separated. Therefore, it is not necessary to align the optical axis. Thus it becomes easy to assemble the semiconductor laser module and oscillation characteristic of the laser is less prone to be changed by mechanical vibrations and the like. Therefore, there is an effect that it is possible to realize a semiconductor laser module that can output a stable laser beam reliably and stably, and at low cost.

According to the present invention, the semiconductor laser device which does not use the fiber grating is used. Therefore, there is an effect that it is possible to use a polarization dependent isolator, different from the in-line fiber type, and it is possible to realize a semiconductor laser module having a small insertion loss and small RIN.

According to the present invention, the above-described semiconductor laser device or the above-described semiconductor laser module is used as an excitation light source for a broadband Raman amplification. With this, it is made possible to obtain the working effect of the above-described semiconductor laser device or the semiconductor laser module. Therefore, there is an effect that it is possible to output stably and highly efficiently the oscillation wavelength selected by the diffraction grating.

According to the present invention, the above-described semiconductor laser device or the above-described semiconductor laser module is used as an excitation light source for a broadband Raman amplification, and as a light source for front-side excitation, or a front-side excitation light source in the bi-directional excitation method. With this, it is possible to obtain the working effect of the above-described semiconductor laser device or the semiconductor laser module. Therefore, there is an effect that it is possible to output stably and highly efficiently the oscillation wavelength selected by the diffraction grating.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device comprising:
   an active layer configured to radiate light;
   a first reflection film provided on a radiation-side end surface of a laser beam;
   a second reflection film provided on a reflection-side end surface of said laser beam, said active layer forming a resonator between said first reflection film and said second reflection film;
   a diffraction grating partially provided in the vicinity of said active layer,
      said diffraction grating being provided in the vicinity of said first reflection grating,
      said diffraction film being formed in isolation with a distance of 50 μm or less from said first reflection film, wherein said diffraction grating is configured to select a laser beam having a plurality of oscillation longitudinal modes having a specific central wavelength.

2. The semiconductor laser device of claim 1, wherein an isolation distance of said diffraction grating from said first reflection film is 50 μm or less.

3. The semiconductor laser device of claim 1, wherein the number of the desired oscillation longitudinal modes is two or more in a half-width of an oscillation wavelength spectrum.

4. The semiconductor laser device of claim 1, wherein said diffraction grating has a diffraction grating length of 300 μm or less.

5. The semiconductor laser device of claim 1, wherein said diffraction grating has a diffraction grating of length equal to or less than a value of (300/1300) times the said resonator length.

6. The semiconductor laser device of claim 1, wherein a multiplication value of said diffraction grating obtained by multiplying a coupling coefficient of said diffraction grating by a diffraction grating length is 0.3 or less.

7. The semiconductor laser device according to claim 1, wherein a grating period of said diffraction grating is varied at random or in a predetermined cycle.

8. The semiconductor laser device according to claim 1, wherein the length of the resonator formed by an active layer formed between said first reflection film and said second reflection film is 800 μm or more.

9. A semiconductor laser module comprising:
a semiconductor laser device of claim 2; an optical fiber guiding a laser beam emitted from said semiconductor laser device to the outside; and
an optical coupling lens system optically coupling said semiconductor laser device with said optical fiber.

10. The semiconductor laser module according to claim 9, further comprising:
a temperature control device controlling a temperature of said semiconductor laser device; and
an isolator being disposed in said optical coupling lens system and suppressing incidence of a reflected return light from the side of said optical fiber.

11. A Raman amplifier, wherein a semiconductor laser device comprising:
an active layer configured to radiate light;
a first reflection film provided on a radiation-side end surface of a laser beam;
a second reflection film provided on a reflection-side end surface of said laser beam, said active layer forming a resonator between said first reflection film and said second reflection film;
a diffraction grating partially provided in the vicinity of said active layer,
said diffraction grating being provided in the vicinity of said first reflection film,
said diffraction grating being formed in isolation with a distance of 50 μm or less from said first reflection film,
wherein said diffraction grating is configured to select a laser beam having a plurality of oscillation longitudinal modes having a specific central wavelength.

12. A Raman amplifier comprising:
a semiconductor laser module comprising:
an active layer configured to radiate light;
a first reflection film provided on a radiation-side end surface of a laser beam;
a second reflection film provided on a reflection-side end surface of said laser beam, said active layer forming a resonator between said first reflection film and said second reflection film;
a diffraction grating partially provided in the vicinity of said active layer,
said diffraction grating being provided in the vicinity of said first reflection film,
said diffraction grating being formed in isolation with a distance of 50 μm or less from said first reflection film,
wherein said diffraction grating is configured to select a laser beam having a plurality of oscillation longitudinal modes having a specific central wavelength;
an optical fiber guiding a laser beam emitted from said semiconductor laser device to the outside; and
an optical coupling lens system optically coupling said semiconductor laser device with said optical fiber.

13. A Raman amplifier comprising:
a semiconductor laser module comprising:
an active layer configured to radiate light;
a first reflection film provided on a radiation-side end surface of a laser beam;
a second reflection film provided on a reflection-side end surface of said laser beam, said active layer forming a resonator between said first reflection film and said second reflection film;
a diffraction grating partially provided in the vicinity of said active layer,
said diffraction grating being provided in the vicinity of said first reflection film,
said diffraction grating being formed in isolation with a distance of 50 μm or less from said first reflection film,
wherein said diffraction grating is configured to select a laser beam having a plurality of oscillation longitudinal modes having a specific central wavelength; an optical fiber guiding a laser beam emitted from said semiconductor laser device to the outside; and
an optical coupling lens system optically coupling said semiconductor laser device with said optical fiber.

14. The Raman amplifier of claim 13, wherein said semiconductor laser device is coupled to said optical fiber at an input side of said optical fiber such that said laser beam is applied in a forward pumping method.

15. The Raman amplifier of claim 13, wherein said semiconductor laser device is coupled to said optical fiber at an output side of said optical fiber such that said laser beam is applied in a backward pumping method.

16. The Raman amplifier of claim 13, wherein said semiconductor laser device is coupled to said optical fiber at both an input and output side of said optical fiber such that said laser beam is applied in both a forward and backward pumping method.

* * * * *